(12) United States Patent
Kezobo et al.

(10) Patent No.: US 9,575,127 B2
(45) Date of Patent: Feb. 21, 2017

(54) MOTOR CONTROL DEVICE AND ELECTRIC POWER STEERING DEVICE USING SAME

(75) Inventors: Isao Kezobo, Chiyoda-ku (JP); Masahiro Iezawa, Chiyoda-ku (JP); Susumu Zeniya, Chiyoda-ku (JP); Eiji Iwami, Chiyoda-ku (JP); Yusuke Fujiki, Chiyoda-ku (JP); Hiroyuki Kishioka, Chiyoda-ku (JP); Sadaaki Kamei, Chiyoda-ku (JP); Yoshihiko Kimpara, Chiyoda-ku (JP); Jiro Okada, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 594 days.

(21) Appl. No.: 14/114,576

(22) PCT Filed: May 7, 2012

(86) PCT No.: PCT/JP2012/061653
§ 371 (c)(1),
(2), (4) Date: Oct. 29, 2013

(87) PCT Pub. No.: WO2012/176553
PCT Pub. Date: Dec. 27, 2012

(65) Prior Publication Data
US 2014/0054103 A1 Feb. 27, 2014

(30) Foreign Application Priority Data

Jun. 24, 2011 (JP) .................................. 2011-140423
Feb. 24, 2012 (JP) .................................. 2012-038893

(51) Int. Cl.
*H02P 7/00* (2016.01)
*G01R 31/34* (2006.01)
*B62D 5/04* (2006.01)

(52) U.S. Cl.
CPC .......... *G01R 31/343* (2013.01); *B62D 5/0463* (2013.01); *B62D 5/0487* (2013.01); *H02P 29/0241* (2016.02); *H02P 29/0243* (2016.02)

(58) Field of Classification Search
CPC ...... H01L 2924/00; H02P 21/06; H02P 27/08; H02P 25/22; B60L 11/14; B60L 2240/421
(Continued)

(56) References Cited

U.S. PATENT DOCUMENTS 6,037,695 A 3/2000 Kanazawa et al.
2003/0222612 A1 12/2003 Matsushita
(Continued)

FOREIGN PATENT DOCUMENTS

JP 5-146195 A 6/1993
JP 2000-177610 A 6/2000
(Continued)

OTHER PUBLICATIONS

Communication dated Nov. 20, 2015 from the European Patent Office in counterpart application No. 12803432.9.
(Continued)

*Primary Examiner* — Eduardo Colon Santana
*Assistant Examiner* — Gabriel Agared
(74) *Attorney, Agent, or Firm* — Sughrue Mion, PLLC; Richard C. Turner

(57) ABSTRACT

Provided are a motor control device (1) for controlling a motor (2) having a plurality of phases, for quickly and accurately detecting a phase in which an open-state fault has occurred when the open-state fault occurs in a target phase. When a power-supply voltage (Vb) is equal to or higher than a predetermined voltage (Vthr), a motor rotation speed (ω) is equal to or lower than a predetermined speed (ωthr), a target x-phase voltage command (Vx*) is not in the vicinity of zero, a current (Ix) of the target x-phase is equal to or
(Continued)

lower than a predetermined current (Iu_thr), and a state in which a control error is equal to or larger than a predetermined error is detected over a predetermined time period or longer, occurrence of an open-state fault in the target phase is determined.

28 Claims, 17 Drawing Sheets

(58) Field of Classification Search
USPC .......................................................... 318/490
See application file for complete search history.

(56) References Cited

U.S. PATENT DOCUMENTS

| | | | |
|---|---|---|---|
| 2006/0043917 A1 | 3/2006 | Kifuku et al. | |
| 2009/0084616 A1* | 4/2009 | Kezobo | B62D 5/0481 180/6.44 |
| 2009/0323232 A1* | 12/2009 | Suzuki | H02M 1/32 361/23 |
| 2012/0274260 A1* | 11/2012 | Takahashi | H02P 29/0243 318/490 |
| 2013/0307448 A1* | 11/2013 | Ikemoto | B62D 5/0487 318/400.02 |
| 2014/0054103 A1* | 2/2014 | Kezobo | B62D 5/0487 180/446 |

FOREIGN PATENT DOCUMENTS

| | | |
|---|---|---|
| JP | 2003-348900 A | 12/2003 |
| JP | 2005-147672 A | 6/2005 |
| JP | 2006-67731 A | 3/2006 |
| JP | 2007-244028 A | 9/2007 |
| JP | 2010-220384 A | 9/2010 |

OTHER PUBLICATIONS

Kai Rothenhagen et al: "Performance of diagnosis methods for IGBT open circuit faults in voltage source active rectifiers" Power Electronics Specialists Conference, 2004. IEEE 35th Annual, Germany, pp. 4348-4354.
Japanese Communication for Counterpart JP 2012-038893, dated Aug. 12, 2013.

* cited by examiner

MOTOR CONTROL DEVICE AND ELECTRIC POWER STEERING DEVICE USING SAME

CROSS REFERENCE TO RELATED APPLICATIONS

This application is a National Stage of International Application No. PCT/JP2012/061653, filed on May 7, 2012, which claims priority from Japanese Patent Application Nos. 2011-140423, filed on Jun. 24, 2011, and 2012-038893, filed on Feb. 24, 2012, the contents of all of which are incorporated herein by reference in their entirety.

TECHNICAL FIELD

The present invention relates to a motor control device including an inverter and an electric power steering device using the motor control device, in particular, to a technology of detecting an open fault in a path from the inverter to a motor.

BACKGROUND ART

Hitherto, in a motor control device, there is known a technology of detecting disconnection of a feedback loop line based on a current deviation between a current command and a measured value of a current flowing through a motor (hereinafter referred to as "current detection value") when the feedback loop line for feeding back the current detection value is disconnected (for example, see Patent Literature 1).

As another conventional device, there is also known the following technology. Namely, when a power-supply voltage falls within an appropriate range, a motor rotation speed falls within a determination target range, an actual current value is equal to or smaller than a predetermined value, and a state in which an applied voltage or a voltage command is out of a predetermined corresponding range continues, it is determined that a power supply line to the motor is disconnected (for example, see Patent Literature 2).

In the case of the technology disclosed in Patent Literature 2, it is possible to detect the phase in which the disconnection has occurred by performing the above-mentioned determination processing for each of three phases in a motor including three-phase motor coils.

According to the above-mentioned method, a threshold value of the predetermined corresponding range of the voltage command is associated with a predetermined current value, which is a threshold value of the current, and a threshold value of the determination target range of the motor rotation speed. As a result, the determination based on a characteristic indicating an output limit of the motor, which is referred to as an N-T characteristic (rotation-speed-torque characteristic), is realized. Namely, the occurrence of disconnection is determined based on whether or not the value exceeds the output limit of the motor.

CITATION LIST

Patent Literature

[PTL 1] JP 2000-177610 A
[PTL 2] JP 2007-244028 A

SUMMARY OF INVENTION

Technical Problems

According to the technology disclosed in Patent Literature 1, the conventional motor control device can detect an abnormal state by using the current deviation. In a case of a permanent-magnet type synchronous motor having a plurality of phases or an AC motor such as an induction motor, the determination is made based on the current deviation, which does not allow the individual evaluation for each phase. Therefore, the conventional controller has a problem in that the type of occurring abnormality and the phase in which the abnormality occurs cannot be identified.

Moreover, with the technology disclosed in Patent Literature 1, there is a risk in that the abnormality is detected even when a bridging fault (such as a ground fault or a power fault) to a negative potential or a positive potential of a battery occurs. Therefore, there is a problem in that the above-mentioned fault cannot be distinguished from the open fault such as the disconnection.

Further, as a result, there is another problem in that processes to be taken in case of the abnormality, which correspond to the phase in which the fault occurs and the contents of the fault, cannot be taken.

On the other hand, according to the technology disclosed in Patent Literature 2, the determination is made for each of the plurality of phases so as to identify the phase in which the disconnection occurs. However, a determination condition and the determination threshold value are set based on whether or not the value exceeds the limit of the N-T characteristic (characteristic indicating the motor output limit). Therefore, there is a low possibility of erroneous detection. On the other hand, a margin for an abnormal range is set excessively large. Thus, there is a problem in that a time period from the occurrence of the fault to the actual detection thereof becomes disadvantageously long, which delays detection timing.

Patent Literature 2 also suggests a determination method using an admittance obtained based on a voltage equation. However, a threshold value to be set is not clearly described. Although detection accuracy and detection speed are unclear, it is however considered that the disclosed threshold-value setting method based on the N-T characteristic is converted and used. Thus, there may be a problem in a low detection speed as described above.

The present invention has been made to solve the problems described above, and therefore has an object to provide a motor control device enabling fault detection in consideration only of a general output range to allow determination of an abnormal state at early time and an electric power steering device using the motor control device.

Solution to Problems

According to the present invention, there is provided a motor control device for controlling a current and an applied voltage to a motor having a plurality of phases, including an inverter for supplying electric power from a power supply to the motor, current control means for generating a voltage command in accordance with a current command to control the current to the motor, an inverter driving circuit for driving the inverter in accordance with the voltage command to control the applied voltage to the motor, and fault detecting means for detecting a fault occurrence state based on the voltage command, a power-supply voltage of the power supply, a motor rotation speed of the motor, and currents in the plurality of phases. When the power-supply voltage is equal to or higher than a predetermined voltage, the motor rotation speed is equal or lower than a predetermined speed, the voltage command of a target phase is not in a vicinity of zero, a phase current of the target phase is equal to or lower than a predetermined current, and a state in which a control error with respect to the current command or the voltage command is equal to or larger than a predetermined error is detected over a predetermined period of time or longer, the fault detecting means determines that an open-state fault has occurred in the target phase.

Advantageous Effects of Invention

According to the present invention, the conditions to be determined for the power-supply voltage and the motor rotation speed are used. As a result, conventional abnormality determination processing based on whether or not a voltage exceeds an output limit of the motor is not required, and the fault detection in consideration only of the general output range is enabled. Based on the determination condition that the voltage command is not in the vicinity of zero (is larger than those of the other phases) and the determination condition that the current is small, it is possible to determine the phase in which there is a doubt about the open-state fault. At the same time, based on the condition to be determined for the control error, the abnormal state can be determined at early time based on an increase in the control error. As a result, a time period from the occurrence of the open-state fault such as the disconnection to the identification of the faulty state can be shortened to advance the detection timing of the fault.

DESCRIPTION OF EMBODIMENTS

First Embodiment

A first embodiment of the present invention is hereinafter described referring to the accompanying drawings.

Figure 1:
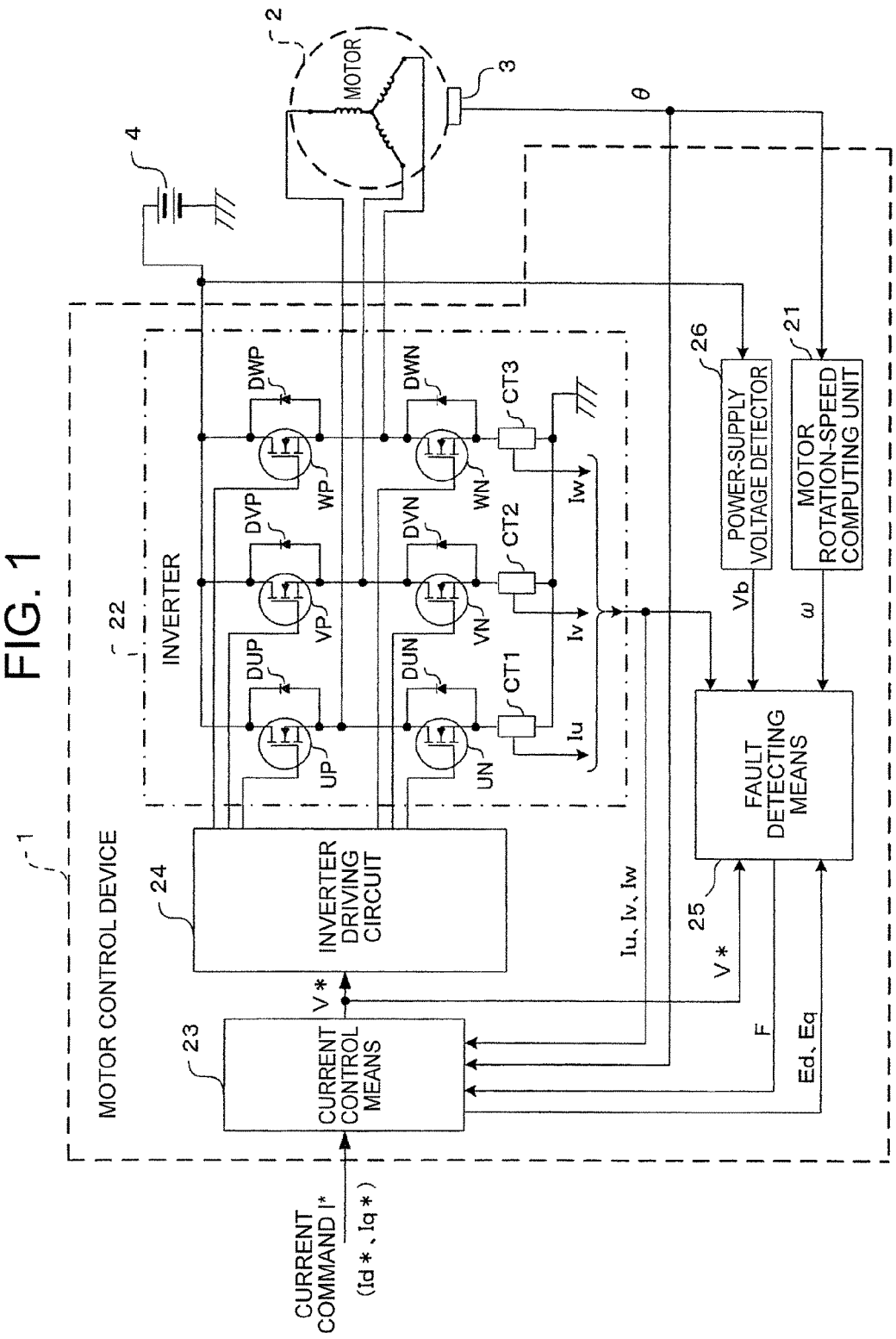
FIG. 1 is a block diagram illustrating a motor control device according a first embodiment of the present invention together with a peripheral configuration thereof (Embodiment 1).

FIG. 1 is a block diagram illustrating a motor control device 1 according to the first embodiment of the present invention together with a peripheral configuration thereof.

In FIG. 1, in the periphery of the motor control device 1, a motor 2 having a plurality of phases (three phases), which is a target to be controlled, a motor rotation-angle sensor 3 for detecting a motor rotation angle θ, a power supply (battery) 4, and current-command generating means (not shown) for generating a current command I* (d-axis current command Id* and q-axis current command Iq*) are provided.

The motor control device 1 adjusts electric power from the power supply 4 so as to control a current (phase current) and an applied voltage to the motor 2 based on the motor rotation angle θ.

The motor 2 is, for example, a three-phase AC motor such as a permanent-magnet type synchronous motor or an induction motor. In this case, it is assumed that the motor 2 has three phases, that is, U-, V-, and W-phases.

The motor control device 1 includes a motor rotation-speed computing unit 21 for computing a motor rotation speed ω, an inverter 22 for controlling power supplied to the motor 2, current control means 23 for generating three-phase voltage commands V* in accordance with the current command I*, an inverter driving circuit 24 for driving the inverter 22, fault detecting means 25 for detecting a fault to output a fault detection result F, and a power-supply voltage detector 26 for detecting a power-supply voltage Vb.

Among the above-mentioned components included in the motor control device 1, the motor rotation-speed computing unit 21, the current control means 23, and the fault detecting means 25 are generally mounted as software for a microcomputer.

The microcomputer includes a known central processing unit (CPU), read-only memory (ROM), random-access memory (RAM), interface (IF), and the like. The microcomputer sequentially extracts programs stored in the ROM to execute desired computation in the CPU and temporarily stores the result of computation in the RAM. In this manner, the software is executed to perform a predetermined control operation.

The inverter 22 includes switching elements UP, UN, VP, VN, WP, and WN respectively corresponding to high-potential sides and low-potential sides of the U-, V-, and W-phases, diodes DUP, DUN, DVP, DVN, DWP, and DWN connected in inverse parallel to the respective switching elements, and current detectors CT1, CT2, and CT3 respectively for detecting currents Iu, Iv, and Iw of the U-, V-, and W-phases.

Detection values of the three-phase currents Iu, Iv, and Iw are input to the current control means 23 and the fault detecting means 25. Further, the motor rotation angle θ from the motor rotation-angle sensor 3 is input to the current control means 23 and the motor rotation-speed computing unit 21.

The three-phase voltage commands V* from the current control means 23 are input to the inverter driving circuit 24 and the fault detecting means 25, whereas the fault detection result F from the fault detecting means 25 is input to the current control means 23.

Further, a control error, that is, a d-axis current deviation Ed and a q-axis current deviation Eq (described below referring to FIG. 2) calculated in the current control means 23 is input to the fault detecting means 25.

Next, a schematic operation of the motor control device 1 illustrated in FIG. 1 is described.

The motor control device 1 fetches the motor rotation angle θ from the motor rotation-angle sensor 3 to calculate the motor rotation speed ω by the motor rotation-speed computing unit 21.

Moreover, the currents Iu, Iv, and Iw respectively flowing through the U-, V-, and W-phases of the motor 2 are detected by the current detectors CT1, CT2, and CT3 included in the inverter 22. The power-supply voltage Vb of the power supply 4 is detected by the power-supply voltage detector 26.

The current control means 23 determines the three-phase voltage commands V* in accordance with the q-axis current command Iq* corresponding to a target value of a motor torque Tm, the d-axis current command Id* corresponding to a target value of an equivalent magnetic field flux, the three-phase currents (detection values) Iu, Iv, and Iw of the motor 2, and the motor rotation angle (detection value) θ. Note that, in a normal state, the fault detection result F is not input to the current control means 23.

The inverter driving circuit 24 performs PWM modulation on the three-phase voltage commands V* to generate switching operation signals (ON/OFF) for the respective switching elements UP, UN, VP, VN, WP, and WN included in the inverter 22.

The inverter 22 realizes chopper control on the switching elements UP, UN, VP, VN, WP, and WN in accordance with the switching operation signals from the inverter driving circuit 24 to determine applied voltages to the respective phases of the motor 2 and to determine the currents Iu, Iv, and Iw for the respective phases based on the power supplied from the power supply 4. By the phase currents Iu, Iv, and Iw, the motor torque Tm is generated.

Note that, the current detectors CT1, CT2, and CT3 are provided in series to the switching elements UP and UN, VP and VN, and WP and WN of the three phases, respectively. However, the current detectors may be provided, for example, in a path between the inverter 22 and the motor 2 or in a path between the power supply 4 and the inverter 22. Further, as an example where one current detector is provided in the path between the power supply 4 and the inverter 22, a configuration in which the currents of the respective phases are detected by a single current detector in accordance with ON/OFF timing of the switching operation signals can also be used.

Further, the diodes DUP, DUN, DVP, DVN, DWP, and DWN are connected in inverse parallel to the respective switching elements UP, UN, VP, VN, WP, and WN. The diodes are generally provided for the purpose of protection of the switching elements.

Further, the three-phase voltage commands V* are directly input from the current control means 23 to the inverter driving circuit 24. However, a value obtained by dividing the three-phase voltage commands V* by the detection value of the power-supply voltage Vb may be obtained as a duty, and the duty value may be input to the inverter driving circuit 24 as a command.

Figure 2:
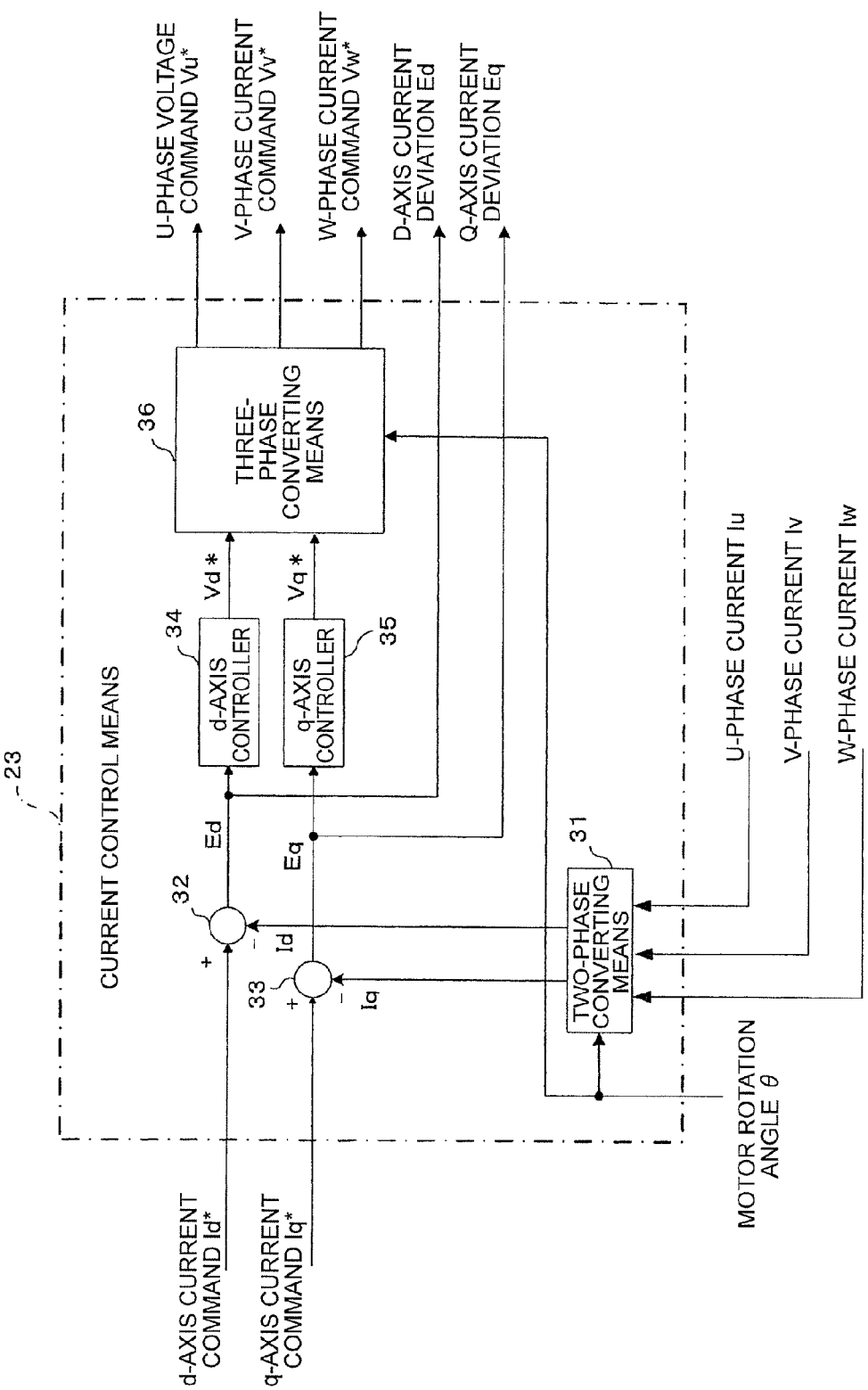
FIG. 2 is a block diagram illustrating a specific configuration of current control means illustrated in FIG. 1 (Embodiment 1).

Next, referring to FIG. 2, a specific configuration and operation of the current control means 23 are described.

FIG. 2 is a block diagram illustrating the specific configuration of the current control means 23, for illustrating input/output signals in the normal state. The current control means 23 can be realized by, for example, a commonly used technique referred to as "dq control".

In FIG. 2, the current control means 23 includes two-phase converting means 31 for converting the three-phase currents (detection values) into two-phase currents (detection values), subtracters 32 and 33 respectively for computing the d-axis current deviation Ed and the q-axis current deviation Eq between the current command and the two-phase currents, a d-axis controller 34 for generating a d-axis voltage command Vd* from the d-axis current deviation Ed, a q-axis controller 35 for generating a q-axis voltage command Vq* from the q-axis current deviation Eq, and three-phase converting means 36 for generating a U-phase voltage command Vu*, a V-phase voltage command Vv*, and a W-phase voltage command Vw* from the d-axis voltage command Vd* and the q-axis voltage command Vq*.

The two-phase converting means 31 uses the motor rotation angle θ to convert the three-phase currents (detection values) Iu, Iv, and Iw into the d-axis current (detection value) Id on the d axis and the q-axis current (detection value) Iq on the q axis.

The subtracter 32 subtracts the d-axis current Id from the d-axis current command Id* to calculate and output the d-axis current deviation Ed to the d-axis controller 34, while the subtracter 33 subtracts the q-axis current Iq from the q-axis current command Iq* to calculate and output the q-axis current deviation Eq to the q-axis controller 35.

Although the illustration of a specific functional configuration of each of the d-axis controller 34 and the q-axis controller 35 is omitted, each of the d-axis controller 34 and the q-axis controller 35 may be configured by common PI control.

For example, the d-axis controller 34 and the q-axis controller 35 respectively include proportional terms for multiplying the d-axis current deviation Ed and the q-axis current deviation Eq by a proportional gain, and integral terms for multiplying integral values of the d-axis current deviation Ed and the q-axis current deviation Eq by an integral gain to add values obtained by the multiplications to generate the d-axis voltage command Vd* and the q-axis voltage command Vq*, respectively.

The three-phase converting means 36 converts the d-axis current command Id* and the q-axis current command Iq* in accordance with the motor rotation angle θ to generate the U-phase voltage command Vu*, the V-phase voltage command Vv*, and the W-phase voltage command Vw*.

After that, the inverter driving circuit 24 and the inverter 22 control the power supplied to the motor 2 in accordance with the U-phase voltage command Vu*, the V-phase voltage command Vv*, and the W-phase voltage command Vw*.

By the operation described above, the d-axis current Id and the q-axis current Iq respectively obtained by converting the phase currents of the motor 2 into the current on the d axis and the current on the q axis are controlled in accordance with the d-axis current command Id* and the q-axis current command Iq*. In addition, by the d-axis current Id and the q-axis current Iq, the phase currents to the motor 2 are controlled. As a result, the motor torque Tm output from the motor 2 can be controlled.

Next, a schematic function of the fault detecting means 25 is described.

The fault detecting means 25 detects in which of the plurality of phases (three phases) an open-state fault has occurred.

The power-supply voltage Vb, the motor rotation speed ω, the respective phase currents Iu, Iv, and Iw, and the d-axis current deviation Ed and the q-axis current deviation Eq calculated in the current control means 23, and the three-phase voltage commands V* (U-phase voltage command Vu*, V-phase voltage command Vv*, and W-phase voltage command Vw*) from the current control means 23 are input to the fault detecting means 25.

The fault detecting means 25 determines whether or not the open-state fault has occurred in each of the phases based on the respective values of the above-mentioned input information.

Note that, the term "fault" means a fault in which each phase is placed in an open state. In the case of the U-phase, the fault corresponds to disconnection of a motor line in the U-phase, or a fault in which any one of components provided in the path from the inverter 22 to the motor 2 in the U-phase is placed in the open state (fault in which the switching element UP or UN included in the inverter 22 is placed in the open state or the like).

When detecting the occurrence of a fault, the fault detecting means 25 generates and inputs the fault detection result F to the current control means 23.

As a result, the current control means 23 can take a process in accordance with the fault. Note that, examples of the process in accordance with the fault include stop of control over the inverter driving circuit 24 and control in case of abnormality in accordance with the fault. However, the process may be any known processing, and therefore the detailed description thereof is herein omitted.

When the power-supply voltage Vb is equal to or higher than a predetermined voltage (Vb≥Vthr), the motor rotation speed ω is equal to or lower than a predetermined speed (ω≤ωthr), and an x-phase voltage command Vx* of a target x-phase (any one of U-, V-, and W-phases) is not in the vicinity of zero (is larger than the voltage commands of the other phases) in a case where a state in which an absolute value |Ix| of a current Ix of the x-phase is equal to or smaller than a predetermined current Ix_thr (|Ix|≤Ix_thr) and the control error (d-axis current deviation Ed and q-axis current deviation Eq) is equal to or larger than a predetermined error is detected over a predetermined period of time or longer, the fault detecting means 25 determines that the open-state fault has occurred in the x-phase.

Namely, in general terms, in the case where the current Ix of the x-phase is small when the abnormal state is determined based on the control error, the occurrence of the open-state fault in the x-phase is determined. The determination is based on a phenomenon that a state in which the current Ix does not flow in the x-phase continues when the open-state fault occurs in the x-phase.

Figure 3:
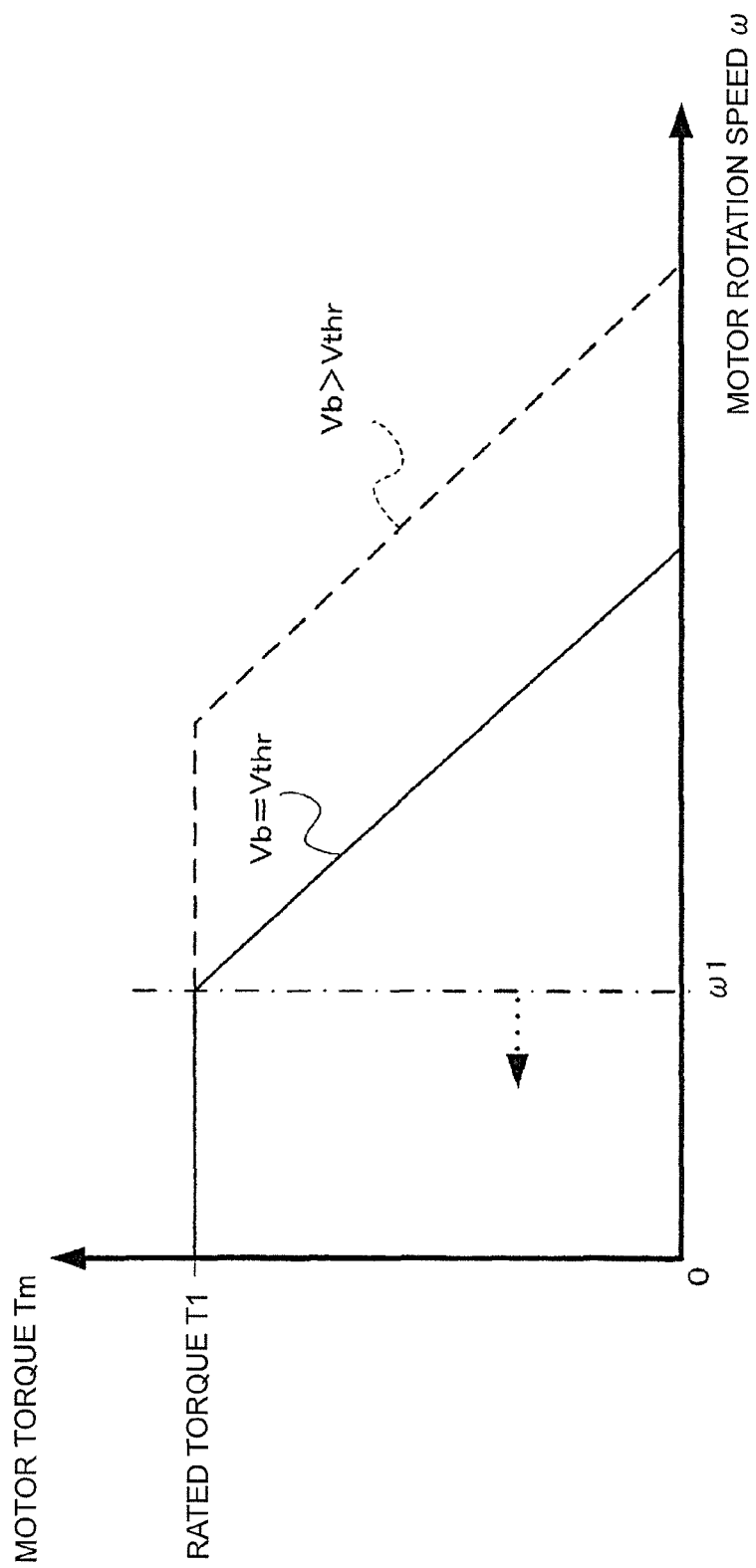
FIG. 3 is an N-T characteristic view showing an output limit of a common motor.
Figure 4:
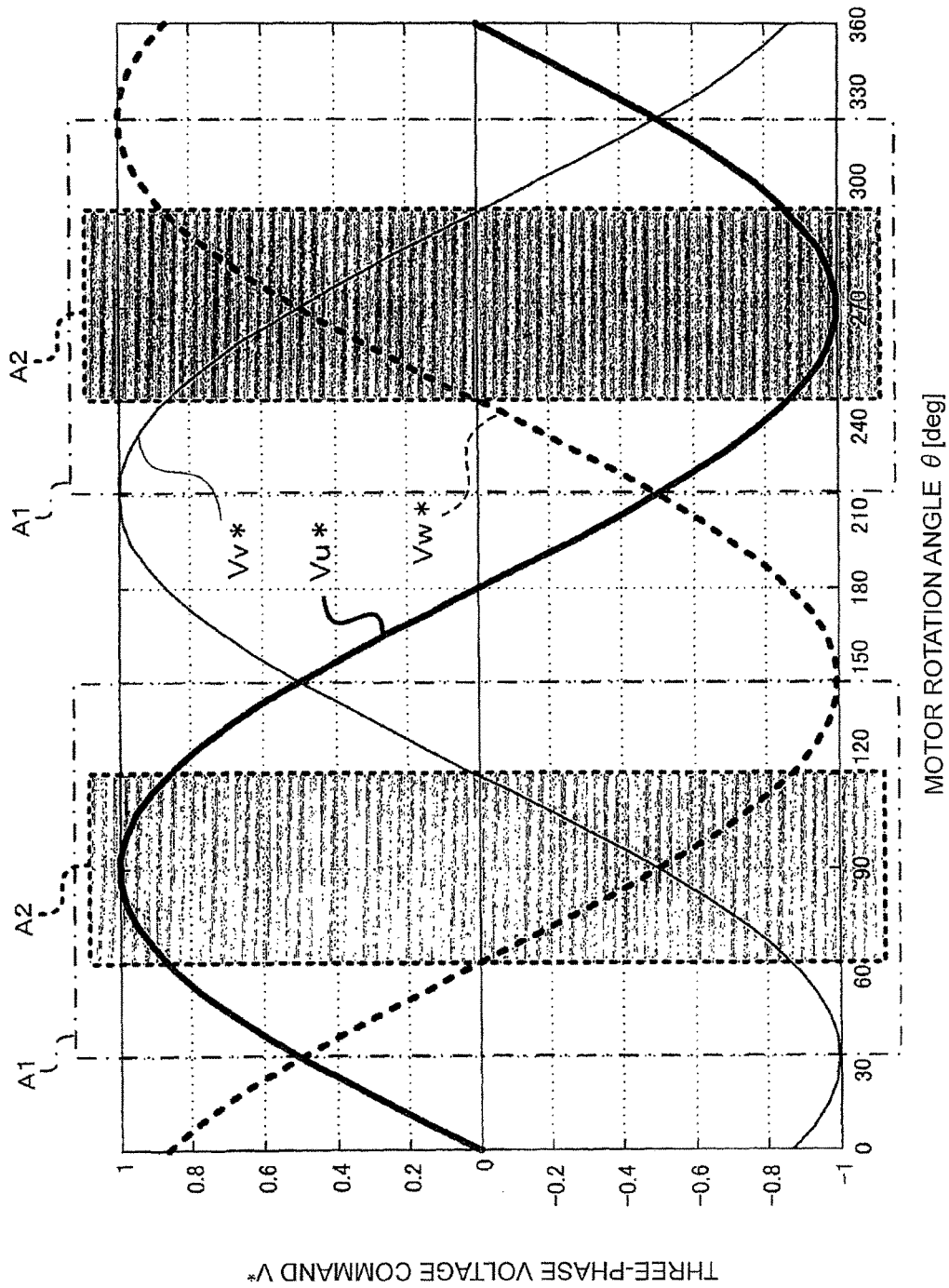
FIG. 4 is a general three-phase waveform diagram showing a region in which a voltage command of a target phase is not in the vicinity of zero (is larger than those of the other phases).
Figure 5:
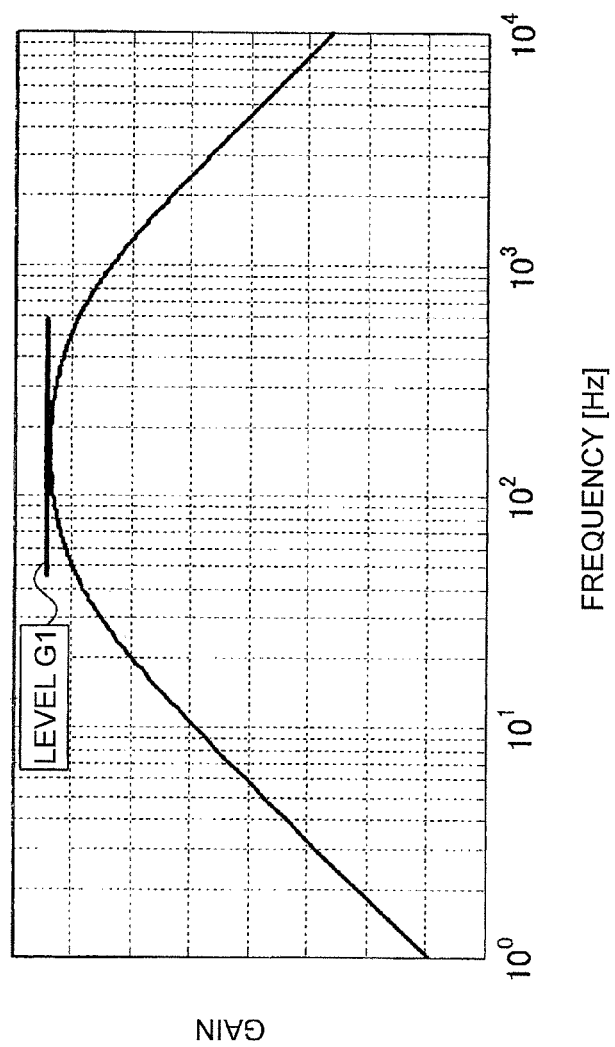
FIG. 5 is a gain characteristic view showing an amplitude amplification factor until a current deviation is affected by a general disturbance voltage.

Next, referring to FIGS. 3 to 5, each of determination conditions in the fault detecting means 25 is concretely described.

First, referring to FIG. 3, a determination condition "the power-supply voltage Vb is equal to or higher than the predetermined voltage Vthr and the motor rotation speed ω is equal to or lower than a rated speed ω1" is described.

FIG. 3 is an N-T characteristic view showing an output limit of the common motor 2.

On the N-T characteristic (characteristic of the motor rotation speed ω-motor torque Tm) shown in FIG. 3, within the range where the power-supply voltage Vb is equal to or higher than the predetermined voltage Vthr (Vb≥Vthr) and the motor rotation speed ω is equal to or lower than the rated speed ω1 (see the arrow in dotted line), the motor torque Tm up to a rated torque T1 can be output. Therefore, as long as the voltage command is up to the rated torque T1, which is generally issued, a voltage command is not saturated, and the motor output is not saturated.

Namely, when the predetermined speed ωthr is set equal to or lower than the rated speed ω1 so as to be limited within the range indicated by the arrow in dotted line, the determination of abnormality based on whether or not the state variable exceeds the output limit of the motor 2 is not required at the time of the determination of abnormality. The fault detection described below can be made in consideration of followability of the control only within the general output range of the motor 2.

On the other hand, according to the conventional method described above, a state variable of the motor 2 reaches a region on the right of the decreasing line shown on the right in FIG. 3. Therefore, whether or not the voltage command is saturated to result in the motor output exceeding the saturated region is required to be determined, which becomes a factor of delayed fault detection.

Next, a determination condition "the target x-phase voltage command Vx* is not in the vicinity of zero (is larger than those of the other phases)" is described.

FIG. 4 is a common three-phase waveform diagram showing regions A1 (see the frame in alternate long and short dashed line) and A2 (see the frame in dotted line) in which the target x-phase voltage command Vx* is not in the vicinity of zero (is larger than those of the other phases).

In FIG. 4, the horizontal axis indicates the motor rotation angle θ [deg], whereas the vertical axis indicates the three-phase voltage commands V*. In this case, changes in the respective values of the U-phase voltage command Vu* (thick solid line), the V-phase voltage command Vv* (thin solid line), and the W-phase voltage command Vw* (dotted line) are shown in a relative manner.

The three-phase voltage commands V* (Vu*, Vv*, and Vw*) are obtained by three-phase conversion of the d-axis voltage command Vd* and the q-axis voltage command Vq* in accordance with the motor rotation angle θ in the three-phase converting means 36 included in the current control means 23.

Therefore, as shown in FIG. 4, the values of the respective phase-voltage commands Vu*, Vv*, and Vw* change so as to relatively change the relationship of magnitudes while periodically repeating increasing and decreasing in accordance with the motor rotation angle θ.

The value of each of the phase-voltage commands Vu*, Vv*, and Vw* sometimes passes through the vicinity of zero. In the vicinity of zero, control is being performed so as not to allow the phase current to flow. Therefore, the phase current has a value close to zero.

For example, when focusing on the U-phase (thick solid line), the voltage command passes through zero in the vicinity of 0 degrees and 180 degrees. Therefore, whether or not the phase current is small is required to be determined only for the case where the target x-phase voltage command Vx* is not present in the vicinity of zero (when a command for allowing the current to flow in the x-phase is output).

In the regions A1 and A2 (regions except for the vicinity of 0 degrees and the vicinity of 180 degrees) shown in FIG. 4, it is understood that the U-phase voltage command Vu* is not in the vicinity of zero. Each of the regions A1 and A2 is expressed by an inequality expression of the three-phase voltage commands V* (Vu*, Vv*, and Vw*) as follows.

Region A1: (Vu*>Vv* and Vu*>Vw*) or (Vu*<Vv* and Vu*<Vw*)

Region A2: |Vu*|>|Vv*| and |Vu*|>|Vw*|

Therefore, by setting the state that the x-phase voltage command Vx* is not present in the vicinity of zero (is larger than those of the other phases) as the determination condition, a state in which the voltage command value is in the vicinity of zero (a state of the voltage command which controls the phase current Ix to the vicinity of zero) can be excluded. Note that, the determination condition has a novel feature in that the phase voltages are relatively compared with each other in contrast to the comparison with a specific threshold value.

Next, referring to FIG. 5, a condition for determining that an abnormal state is brought about by a fault, that is, "control error is equal to or larger than a predetermined error", is described.

FIG. 5 is a gain characteristic view showing an amplitude amplification factor until a general disturbance voltage responds to the d-axis current deviation Ed and the q-axis current deviation Eq.

FIG. 5 shows a frequency characteristic of the amplitude amplification factor in the path after the disturbance voltage is superimposed on the coils of the motor 2 until the disturbance voltage responds to the d-axis current deviation Ed and the q-axis current deviation Eq through the PI control system included in the motor control device 1.

Namely, in order to show an abnormal range of the control error, the amplitude amplification factor from the disturbance voltage exerted on the motor 2 to the d-axis current deviation Ed and the q-axis current deviation Eq is represented by the frequency characteristic showing current followability in common current control.

It is understood that, in this case, the disturbance voltage in the vicinity of 100 [Hz] becomes the maximum response (level G1) to affect the d-axis current deviation Ed and the q-axis current deviation Eq.

The control errors herein used for the determination of abnormality are the d-axis current deviation Ed and the q-axis current deviation Eq.

In FIG. 5, the horizontal axis indicates the frequency [Hz], and the vertical axis indicates the gain (amplitude amplification factor).

For a system having the current as the state variable, an induced voltage proportional to the motor rotation speed ω acts as the disturbance voltage to respond to the d-axis current deviation Ed and the q-axis current deviation Eq based on the gain characteristic shown in FIG. 5. At this time, the response gain indicated by the level G1 in FIG. 5 becomes the maximum response.

Further, a maximum value of the disturbance voltage to be taken into consideration is a value (=Ke×ωthr) obtained by multiplying the predetermined speed ωthr which is a threshold value for the condition to be determined for the motor rotation speed ω by an induced-voltage constant Ke.

Thus, a maximum current deviation is a value (=G1×Ke×ωthr) obtained by multiplying the response gain at the level G1 and the maximum value of the disturbance voltage, Ke×ωthr.

Note that, as a factor of generation of the d-axis current deviation Ed and the q-axis current deviation Eq, the followability to a change in the value of the current command I* can also be given. However, the above-mentioned change is sufficiently small as compared with the response of the disturbance voltage, and therefore is negligible.

The maximum current deviation G1×Ke×ωthr within the general output range in the normal state in which the fault does not occur is obtained in the above-mentioned manner. Therefore, a threshold value (predetermined error Ethr) indicating an abnormal state of the d-axis current deviation Ed and the q-axis current deviation Eq may be set to a value larger than the above-mentioned maximum current deviation G1×Ke×ωthr.

Note that, by setting the threshold value to a value somewhat larger than the maximum current deviation G1×Ke×ωthr, a margin for erroneous detection can also be obtained.

Moreover, the control error (d-axis current deviation Ed and q-axis current deviation Eq) is composed of the two signals. For evaluation as a single control error, a square root of sum of squares, $\sqrt{(Ed^2+Eq^2)}$, may be obtained by a computation so as to be used.

Note that, for the estimation of the maximum value of the response gain of the current, accuracy can be further improved by taking a width of a parameter fluctuation (variation) such as a circuit constant into consideration.

Finally, as a condition for determination of a state in which the current is not flowing, the following can be specified. Namely, an abnormality occurs in the x-phase by applying the current of the target x-phase having an absolute value |Ix| equal to or smaller than the predetermined current Ix_thr (|Ix|≤Ix_thr), and the content of the abnormality in the x-phase is "the phase current Ix does not flow".

Note that, the predetermined current Ix_thr may be set in consideration of noise and resolution of the phase current (detection value).

Figure 6:
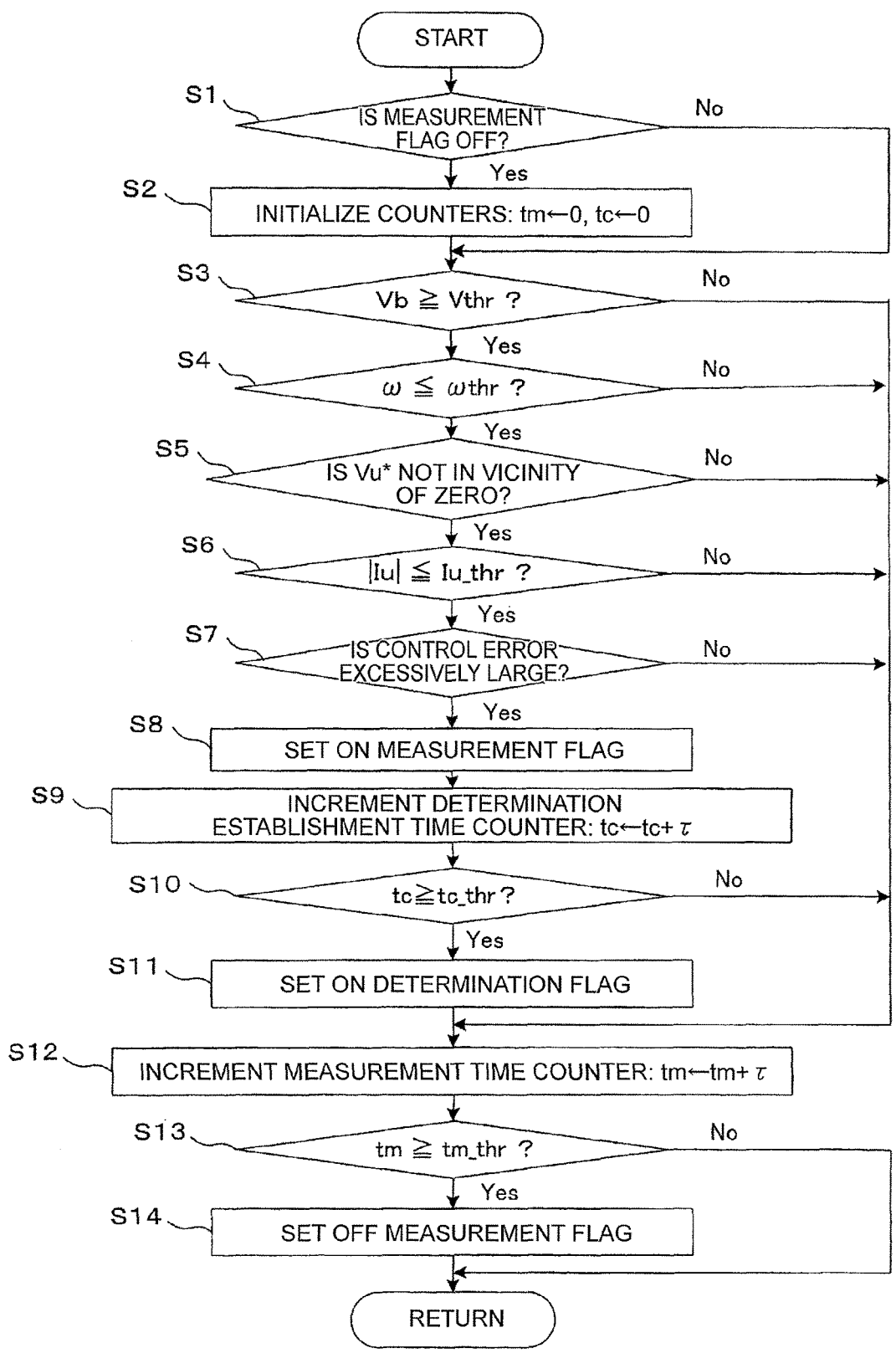
FIG. 6 is a flowchart illustrating a specific operation of fault detecting means according to the first embodiment of the present invention (Embodiment 1).

Next, referring to a flowchart of FIG. 6, a specific operation of the fault detecting means 25 is described.

Focusing representatively on the U-phase, FIG. 6 illustrates means of detecting the disconnection of the motor line in the U-phase or the fault in which any of the components (such as the switching element UP or UN) present in the path from the inverter 22 to the motor 2 in the U-phase is placed in the open state.

Note that, although not shown, the fault detecting means 25 includes similar means to that illustrated in FIG. 6 respectively for the V-phase and the W-phase, which respectively detect a fault in which the V-phase and the W-phase are placed in the open state.

First, it is determined whether or not a measurement flag indicating that current time is within the range of a measurement time period in which the number of times of satisfaction of the determination conditions is counted is in an OFF state (Step S1). When it is determined that the measurement flag is in the OFF state (that is, Yes), the current time is not within the measurement time period. Therefore, counters corresponding to time signals tm and tc are initialized (Step S2). Then, the processing proceeds to Step S3.

Concretely, in Step S2, the time signal tm for counting time within the measurement time period and the time signal tc indicating an integrated value of a time period during which the determination condition is established are initialized to zero.

On the other hand, when it is determined in Step S2 that the measurement flag is in an ON state (that is, No), the current time is within the measurement time period. Therefore, after skipping Step S2, it is determined whether or not the power-supply voltage Vb is equal to or higher than the predetermined voltage Vthr (Vb≥Vthr) (Step S3).

When it is determined in Step S3 that Vb<Vthr is satisfied (that is, No), the processing proceeds to Step S12 described below.

On the other hand, when it is determined in Step S3 that Vb≥Vthr is satisfied (that is, Yes), it is then determined whether or not the motor rotation speed ω is equal to or lower than the predetermined speed ωthr (ω≤ωthr) (Step S4). When it is determined that ω>ωthr is satisfied (that is, No), the processing proceeds to Step S12 described below.

On the other hand, when it is determined in Step S4 that ω≤ωthr (that is, Yes) is satisfied, it is then determined whether or not the U-phase voltage command Vu* is not in the vicinity of zero (U-phase voltage command Vu* is maximum) (Step S5).

Step S5 corresponds to determination of whether or not the value of the U-phase voltage command Vu* falls within the range A1 (or the range A2) shown in FIG. 4.

When it is determined in Step S5 that the U-phase voltage command Vu* is in the vicinity of zero (that is, No), the processing proceeds to Step S12 described below. On the other hand, when it is determined in Step S5 that the U-phase voltage command Vu* is not in the vicinity of zero (that is, Yes), it is then determined whether or not the absolute value of the U-phase current Iu is equal to or smaller than the predetermined current Iu_thr (|Iu|≤Iu_thr) (Step S6).

When it is determined in Step S6 that |Iu|>Iu_thr is satisfied (that is, No), the processing proceeds to Step S12 described later. On the other hand, when it is determined in Step S6 that |Iu|≤Iu_thr is satisfied (that is, Yes), it is then determined whether or not the control error is excessively large (the d-axis current deviation Ed and the q-axis current deviation Eq are equal to or larger than the predetermined error Ethr) (Step S7).

When it is determined in Step S7 that the control error is not excessively large (for example, √(Ed^2+Eq^2<Ethr)) (that is, No), the processing proceeds to Step S12 described later. On the other hand, when it is determined in Step S7 that the control error is excessively large (√(Ed^2+Eq^2≥Ethr)) (that is, Yes), the measurement flag is set to the ON state (Step S8).

Subsequently, a determination establishment time counter is incremented (Step S9).

Concretely, in Step S9, the time signal tc, which is integrated value of the time period during which the determination condition is established, is incremented by adding a computation period τ to a current value of the time signal tc (tc=tc+τ).

Next, whether or not the time signal tc for establishment of determination has reached a predetermined time tc_thr (tc≥tc_thr) is determined (Step S10). When it is determined that tc<tc_thr is satisfied (that is, No), the processing proceeds to Step S12 described later. On the other hand, when it is determined that tc≥tc_thr is satisfied (that is, Yes), a determination flag is set to an ON state (Step S11).

In Step S11, the determination flag set to the ON state corresponds to the detection of occurrence of an open-state fault in the U-phase.

Subsequently, in Step S12, a measurement time counter is incremented (Step S12).

Concretely, in Step S12, the time signal tm for counting time within the measurement time period is incremented by adding the computation period τ to a current value of the time signal tm (tm=tm+τ).

Finally, it is determined whether or not the time signal tm for counting time within the measurement time period has reached a measurement time period tm_thr (tm≥tm_thr) (Step S13). When it is determined that tm<tm_thr is satisfied (that is, No), the processing illustrated in FIG. 6 is terminated and returns.

On the other hand, when it is determined in Step S13 that tm≥tm_thr is satisfied (that is, Yes), the measurement flag is set to the OFF state (Step S14). Then, the processing illustrated in FIG. 6 is terminated and returns.

After that, the processing (Steps S1 to S14) from the start illustrated in FIG. 6 is repeatedly performed again.

Note that, by performing the count processing of the time signal tc using the integration as in Step S9, the detection of the fault can be determined when the integrated time of the time period during which the determination is established becomes equal to or larger than the threshold value within the measurement time period even if the determination conditions are not continuously satisfied.

Figure 7:
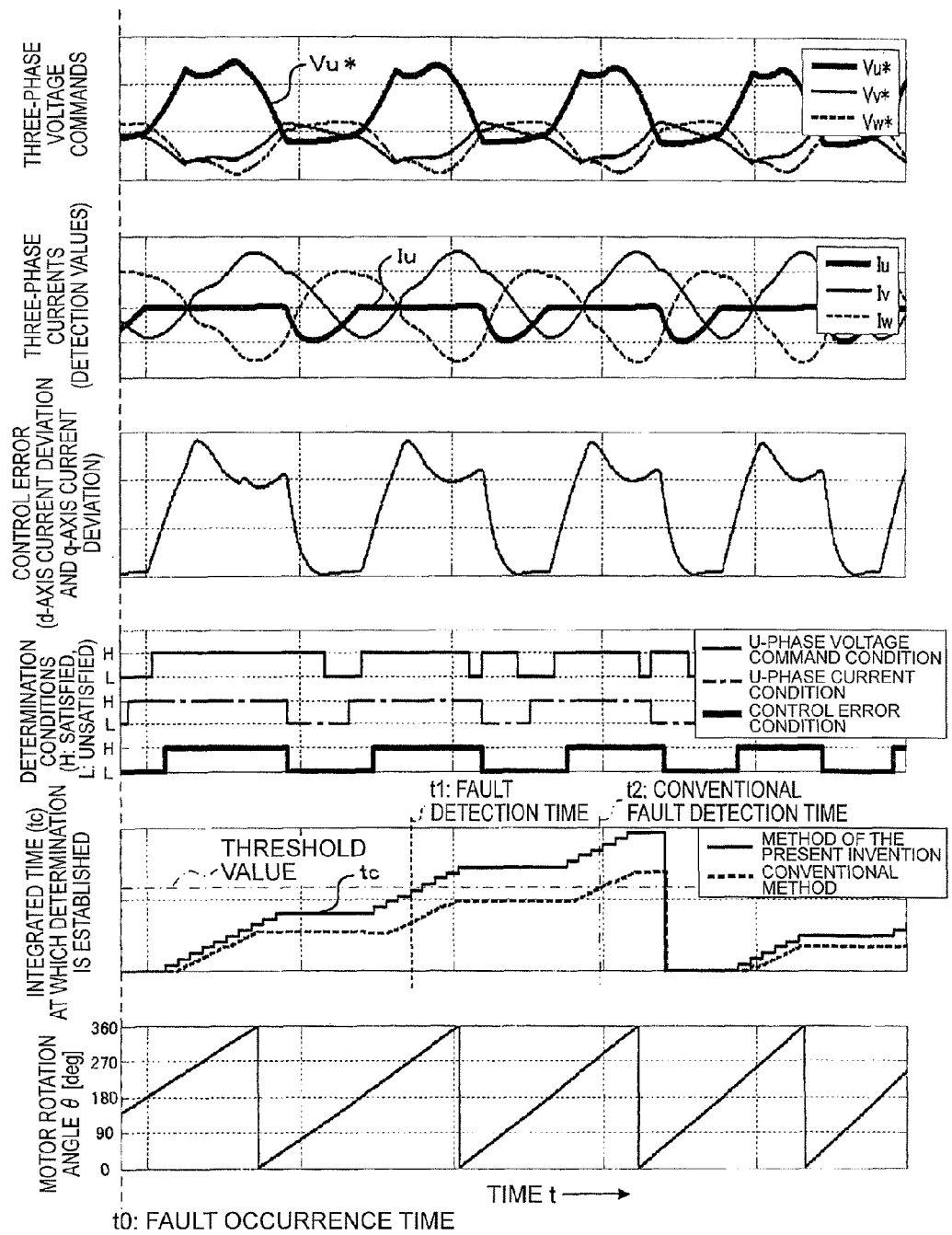
FIG. 7 is a timing chart showing time response waveforms of state quantities when a fault in which an upper U-phase switching element is placed in an open state occurs in the first embodiment of the present invention (Embodiment 1).

Next, referring to FIG. 7, a time response of each of state quantities when a fault in which an upper (high-potential side) U-phase switching element UP is placed in the open state occurs in the motor control device 1 according to the first embodiment of the present invention is described.

FIG. 7 is a timing chart showing time response waveforms of the respective state quantities when the switching element UP is placed in the open state, and representatively shows operation waveforms when a fault in the U-phase is detected as in the case of FIG. 6.

In FIG. 7, the horizontal axis indicates time t. Respective temporal changes in the three-phase voltage commands V* (Vu*, Vv*, and Vw*), the three-phase currents (detection values) Iu, Iv, and Iw, the control error (d-axis current deviation Ed and q-axis current deviation Eq), the determination conditions (H: satisfied, L: unsatisfied), the integrated time (tc) of the time period during which the determination is established, and the motor rotation angle θ [deg], are respectively indicated on the vertical axis.

In parts showing the three-phase voltage commands and the three-phase currents (waveforms in the first row and the second row), the thick solid line indicates a waveform of the U-phase, the solid line indicates a waveform of the V-phase, and the broken line indicates a waveform of the W-phase.

Further, in a part showing the determination conditions (waveforms in the fourth row), the solid line indicates a waveform for the condition to be determined for the U-phase voltage command Vu*, the alternate long and short dashed line indicates a waveform for the condition to be determined for the U-phase current Iu, and the thick solid line indicates a waveform for the condition to be determined for the control error, each indicating whether the determination condition is satisfied (H) or not satisfied (L).

Here, the case where the U-phase switching element UP on the high-potential (power supply 4) side is brought into the open state at a fault occurrence time t0 shown at the left end and the fault is detected at a fault detection time t1 is shown.

In FIG. 7, based on the open state of the upper U-phase switching element UP, it is understood that there are horizontal waveform time periods in which the U-phase current Iu (see the thick line among the waveforms in the second row) is fixed to zero (the current does not flow), in a period in which the current should naturally otherwise flow so that the line is present on the upper side of the part of the figure.

Moreover, in approximately the same periods as those of the horizontal waveform time periods described above, it is understood that the U-phase voltage command Vu* (see the thick line among the waveforms in the first row) becomes relatively larger than those of the other phases and the control error (d-axis current deviation Ed and q-axis current deviation Eq) (see the waveform in the third row) increases.

It is understood that, reflecting the above-mentioned state, the condition to be determined for the U-phase voltage command Vu* (see the solid line), the condition to be determined for the U-phase current Iu (see the alternate long and short dashed line), and the condition to be determined for the control error (see the thick solid line) are satisfied (all become the H-level), as shown in the part showing the determination conditions (waveforms in the fourth row).

Further, although not shown, the conditions to be determined for the power-supply voltage Vb and the motor rotation speed ω are always satisfied.

The time signal tc for establishment of the determination (see the solid line among the waveforms in the fifth row) is incremented (integrated) when all the determination conditions are satisfied as described above. Therefore, during a period in which the determination conditions are satisfied, the time signal tc increases along with elapse of time t.

The fault detection time t1 is time at which the integrated time signal tc exceeds predetermined time tc_thr (threshold value for determining the fault detection). At the fault detection time t1, the open-state fault in the U-phase is determined.

On the other hand, integrated time obtained by the conventional method (see the broken line among the waveforms in the fifth row) has a smaller pitch of increase because of delayed detection timing. Therefore, it is understood that a fault detection time t2 is later than the fault detection time t1 according to the first embodiment of the present invention.

Note that, a change in the motor rotation angle θ (waveform in the sixth row; the lowermost row) shows that the motor 2 rotates at approximately the same speed.

The vicinity of the motor rotation angle θ=350 [deg] corresponds to the vicinity of the center of each of the horizontal waveform time periods during which the U-phase current Iu does not flow. It is understood that the time period in which the U-phase current Iu does not flow is approximately periodically synchronous with the motor rotation angle θ. Therefore, the condition to be determined for the U-phase voltage command Vu* and the like can be substituted by the use of the motor rotation angle θ.

Now, for the above-mentioned fault detection operation according to the first embodiment of the present invention, roles of the determination conditions are summarized and generally described.

First, by using the conditions to be determined for the power-supply voltage Vb and the motor rotation speed ω, the fault can be detected in consideration only of the general output range of the motor 2. Therefore, the determination of abnormality based on the output limit of the motor 2 can be eliminated.

Moreover, by using the determination condition that the target x-phase voltage command Vx* is larger than those of the other phases, the state in which the current is controlled to the vicinity of zero can be excluded. In addition, by using the condition to be determined for the current, the state in which the x-phase current does not flow can be detected. Therefore, it is possible to determine the phase in which there is a doubt about the open-state fault.

Further, based on the condition to be determined for the control error, it is possible to detect whether or not the state is abnormal.

Therefore, when the above-mentioned conditions are all satisfied, the occurrence of the open-state fault in the x-phase can be detected. Moreover, by performing the same determination processing as that described above for all the phases, it is possible to detect the phase in which the open-state fault has occurred.

Moreover, for the followability of the current control to the motor 2, the followability is kept within the generally used appropriate range so as not to needlessly increase the control error.

In terms of the followability of the motor control designed as described above, the maximum value of the control error (such as the d-axis current deviation Ed and the q-axis current deviation Eq) generated by the disturbance or the like is estimated from a threshold value for the condition to be determined for the motor rotation speed ω or the like and a width of a parameter fluctuation (variation).

The thus estimated maximum value of the control error is determined as a threshold value of the abnormal range of the control error. As a result, erroneous fault detection can be avoided.

Thus, the abnormality determination is performed based on whether or not the control error is normal without using the determination of whether or not the state variable exceeds the output limit. As a result, the fault can be detected earlier.

Further, by determining whether or not the x-phase voltage command Vx* of the target phase is not within the vicinity of zero (is larger than those of the other phases), the erroneous detection caused when the x-phase voltage command Vx* is in the vicinity of zero can be prevented. Therefore, the improvement of detection accuracy and the rapidity of detection can be both achieved.

With the motor control device 1 according to the first embodiment (FIGS. 1 to 7) of the present invention, the abnormal state is determined based on the control error using, as the threshold value, the maximum value of the control error within the general operation range, which is estimated from the threshold value of the condition to be determined for the motor rotation speed ω or the like without determining the abnormal state based on the output limit of the motor 2. Therefore, when detecting the phase in which the open-state fault has occurred, it is not necessary to detect that the state quantities such as the phase currents (detection values) Iu, Iv, and Iw and the three-phase voltage commands V* exceed the output limit. Therefore, the occurrence of the abnormal state can be determined based on the increase in the control error.

Therefore, a time period from the occurrence of the fault to the identification of the faulty state can be shortened. Therefore, the effect of enabling early detection of the fault is obtained. Further, as a result, the measures in accordance with the fault can be rapidly taken.

Note that, although the d-axis current deviation Ed and the q-axis current deviation Eq are used as the control error in the description given above, the d-axis current command Id* and the q-axis current command Iq* may be used instead.

Further, as is apparent from FIG. 2, the current deviation is a value obtained by subtracting the current detection value from the current command. An increase in the value of the current deviation at the occurrence of a fault means a state in which the current detection value does not follow the current command even though the current command is equal to or larger than the predetermined value.

Therefore, when the state in which the phase current does not flow is detected even though the current command is equal to or larger than the predetermined value and the phase voltage is relatively large, the occurrence of the open-state fault in the corresponding phase can be determined. Therefore, even when a square root of the squares of the d-axis current command Id* and the q-axis current command Iq* is used as the control error in place of the d-axis current deviation Eq and the q-axis current deviation Eq, the same functions and effects as those described above are provided.

As described above, in order to control the currents (three-phase currents Iu, Iv, and Iw) and the applied voltage to the motor 2 having the plurality of phases, the motor control device 1 according to the first embodiment (FIGS. 1 to 7) of the present invention includes the inverter 22 for supplying the electric power from the power supply 4 to the motor 2, the current control means 23 for generating the three-phase voltage commands V* in accordance with the current command I* to control the currents (three-phase currents Iu, Iv, and Iw) to the motor 2, the inverter driving circuit 24 for driving the inverter 22 in accordance with the three-phase voltage commands V* to control the applied voltage to the motor 2, and the fault detecting means 25 for detecting the fault occurrence state based on the three-phase voltage commands V*, the power-supply voltage Vb of the power supply 4, the motor rotation speed ω of the motor 2, and the currents Iu, Iv, and Iw of the plurality of phases.

When the state in which the power-supply voltage Vb is equal to or higher than the predetermined voltage Vthr, the motor rotation speed ω is equal to or lower than the predetermined speed ωthr, the x-phase voltage command Vx* of the target phase is not in the vicinity of zero (is larger than those of the other phases), the current Ix of the x-phase is equal to or lower than the predetermined current Ix_thr, and the d-axis current deviation Ed and the q-axis current deviation Eq (control error with respect to the current command or the voltage command) are equal to or larger than the predetermined error Ethr is detected over the predetermined time period tc_thr or longer, the fault detecting means 25 determines the occurrence of the open-state fault in the x-phase, generates the fault detection result F, and inputs the fault detection result F to the current control means 23.

Further, the control error has a value in accordance with the current command I* or the current deviation (d-axis current deviation Ed and q-axis current deviation Eq) between the value of the current command I* and the current (d-axis current Id and q-axis current Iq).

As described above, by using the conditions to be determined for the power-supply voltage Vb and the motor rotation speed ω, the determination of abnormality based on whether or not the state variable exceeds the output limit of the motor 2 becomes unnecessary, and the fault detection in consideration only of the general output range can be realized.

Moreover, it is possible to determine the phase in which there is a doubt about the open-state fault based on the determination condition that the three-phase voltage commands V* is not in the vicinity of zero (is larger than those of the other phases) and the determination condition that the three-phase currents Iu, Iv, and Iw are small.

Further, based on the condition to be determined for the control error, the abnormal state can be determined earlier based on the increase in the control error.

Therefore, the time period from the occurrence of the open-state fault such as the disconnection to the identification of the faulty state can be shortened, which enables rapid detection of the fault.

Second Embodiment

Figure 8:
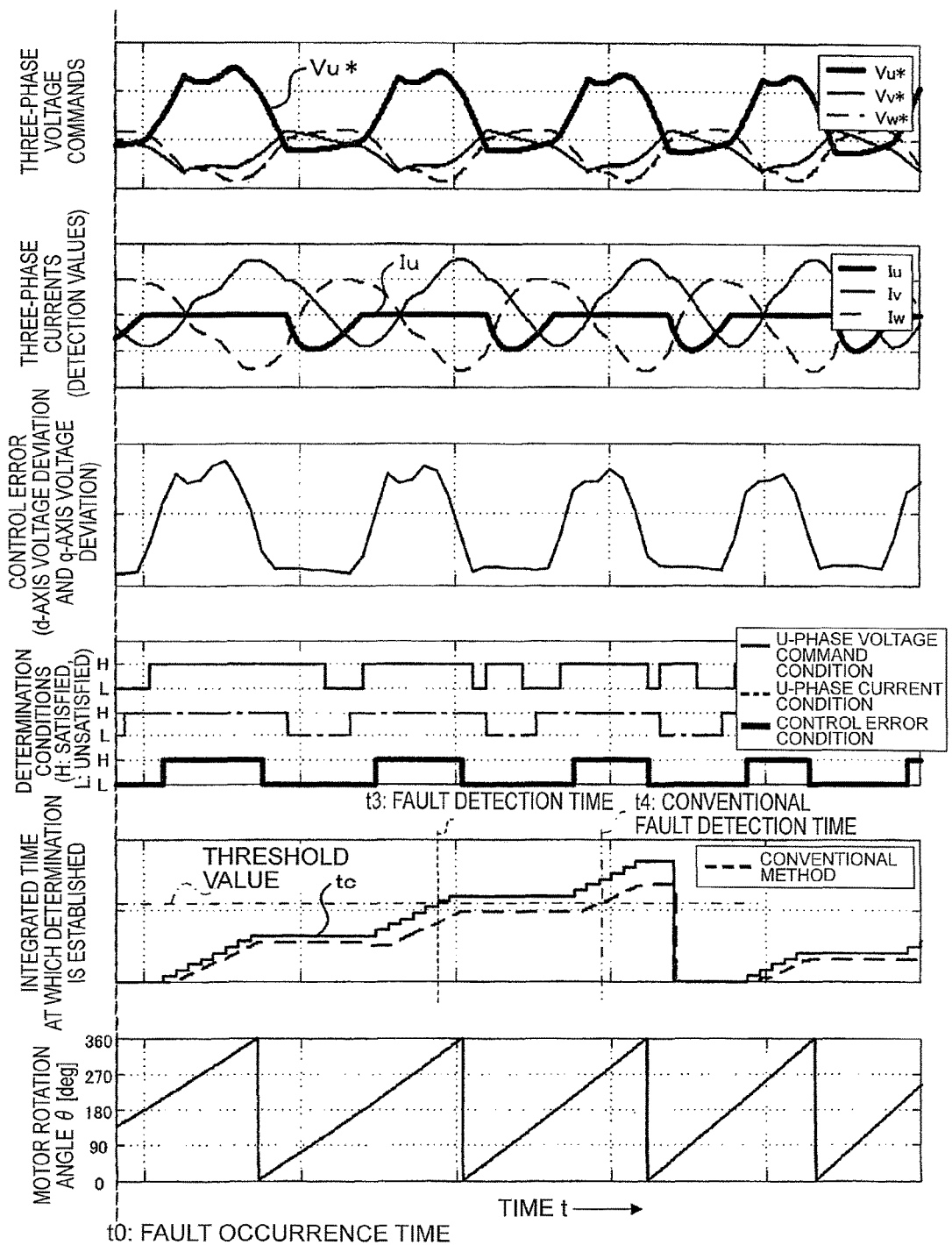
FIG. 8 is a timing chart showing time response waveforms of state quantities when a fault in which an upper U-phase switching element is placed in an open state occurs in a second embodiment of the present invention (Embodiment 2).

Note that, although the d-axis current deviation Ed and the q-axis current deviation Eq are used as the control error to be input from the current control means 23 to the fault detecting means 25 in the first embodiment described above (FIGS. 1 to 7), a d-axis voltage deviation Evd and a q-axis voltage deviation Evq may be used instead, as shown in FIG. 8.

FIG. 8 is a timing chart showing a fault detection operation according to a second embodiment of the present invention, and shows time response waveforms of the respective state quantities when the fault in which the upper U-phase switching element UP (FIG. 2) is placed in the open state occurs as in the case described above (see FIG. 7).

In FIG. 8, only the d-axis current deviation Ed and the q-axis current deviation Eq described above (FIG. 7) are replaced by the d-axis voltage deviation Evd and the q-axis voltage deviation Evq (see the waveforms in the third row), and the other parameters are the same those described above (FIG. 7).

An overall configuration of the motor control device according to the second embodiment of the present invention is as illustrated in FIG. 1, and the fault detection processing thereof is basically as illustrated in FIG. 6. In this case, however, the d-axis voltage deviation Evd and the q-axis voltage deviation Evq are used for the condition to be determined for the control error.

When the open-state fault occurs in one of the phases of the motor 2, not only the phase current does not follow the current command I*, but also an error of the actual applied voltage with respect to the three-phase voltage commands V* becomes excessively large. Therefore, the abnormal state can be determined by monitoring a voltage deviation between the three-phase voltage commands V* and the applied voltage.

Here, values of the applied voltage on the d axis and the q axis are respectively a d-axis voltage value Vd and a q-axis voltage value Vq, and values respectively obtained by subtracting the d-axis voltage value Vd from the d-axis voltage command Vd* and subtracting the q-axis voltage value Vq from the q-axis voltage command Vq* are respectively the d-axis voltage deviation Evd and the q-axis voltage deviation Evq. A concrete method of calculating the d-axis voltage value Vd and the q-axis voltage value Vq is described below.

To evaluate the d-axis voltage deviation Evd and the q-axis voltage deviation Evq as a single value, a square root of sum of squares, √(Evd^2+Evq^2), may be used as the control error as in the case described above.

A concrete method of determining the predetermined error Ethr which is the threshold value of the condition to be determined for the control error is also described later.

In the following, first to sixth calculation methods of obtaining the d-axis voltage value Vd and the q-axis voltage value Vq are described.

(1) First, in the first calculation method, three voltage sensors (not shown) for individually detecting the three-phase voltages are provided in the path from the inverter 22 to the motor 2. The detection values of the voltage sensors are subjected to two-phase conversion based on the motor rotation angle θ so as to be converted into the voltage value on the d axis and the voltage value on the q axis. The voltage values obtained by the conversion are used as the d-axis voltage value Vd and the q-axis voltage value Vq.

In this case, the predetermined error Ethr which is the threshold value of the condition to be determined for the control error is set in consideration of a maximum value of the voltage deviation, which may be generated in the normal state.

Namely, the maximum value of the voltage deviation in the normal state, such as a dead band in which switching over extremely short time, which is necessary for PWM modulation of the three-phase voltage commands V*, is stopped, a detection error of the power-supply voltage Vb used for the two-phase conversion, a loss generated at the time of switching of the switching elements included in the inverter 22, and a voltage drop due to a resistance of a wire or a component of the motor 2 other than the coils, is estimated. The predetermined error Ethr may be set to a value larger than the estimated value.

At this time, a margin for the erroneous detection can be obtained by setting the predetermined error Ethr to a value somewhat larger than the maximum voltage deviation in the normal state.

Moreover, the accuracy of estimation of the error can be improved by taking a variation in the components into consideration.

(2) Next, the second calculation method is described.

In this case, the d-axis voltage value Vd and the q-axis voltage value Vq are obtained by an estimation computation based on voltage equations on the d axis and the q axis as described in the following Expressions (1), without using the above-mentioned voltage sensors.

[Math. 1]

$$V_d = R \cdot I_d - \omega \cdot L \cdot I_q + L \cdot dI_d/dt$$

$$V_q = R \cdot I_q + \omega \cdot L \cdot I_d + \omega \cdot \Psi_a + L \cdot dI_q/dt \quad (1)$$

In Expressions (1), R, L, and $\Psi_a$ are known circuit constants; R is a resistance value from the inverter 22 to the motor 2, L is an inductance of the motor 2, and $\Psi_a$ is an armature interlinkage flux generated by permanent magnets included in the motor 2.

The state quantities in the right side of each of Expressions (1), that is, the d-axis current Id, the q-axis current Iq, and the motor rotation speed ω can be detected or calculated in the motor control device 1, as described above (FIGS. 1 and 2).

Therefore, in this case, by performing computation processing expressed in the right side of each of Expressions (1) based on the detection values of the d-axis current Id, the q-axis current Iq, and the motor rotation speed ω, the motor control device 1 can calculate the d-axis voltage value Vd and the q-axis voltage value Vq.

When the second calculation method is used as described above, the predetermined error Ethr which is the determination threshold value of the maximum control error in the normal state is set as follows.

First, the maximum values of the computation errors of the d-axis voltage value Vd and the q-axis voltage value Vq in the normal state are determined according to the combination in which the computation errors of the d-axis voltage value Vd and the q-axis voltage value Vq becomes maximum, based on the maximum values of the variations in the circuit constants R, L, and $\Psi_a$, the d-axis current Id, the q-axis current Iq, and a detection error of the motor rotation speed ω.

Subsequently, a value is obtained by adding the maximum values of the d-axis voltage deviation Evd and the q-axis voltage deviation Evq from the three-phase voltage commands V* to the actual applied voltage to the maximum values of the computation errors of the d-axis voltage value Vd and the q-axis voltage value Vq. The predetermined error Ethr is set to a value larger than the value obtained by the addition. By setting the predetermined error to a value somewhat larger than the value obtained by the addition, a margin for the erroneous detection can also be obtained.

(3) Next, a third calculation method is described.

The third calculation method corresponds to a method in which the terms containing the d-axis current Id except for the derivative terms are eliminated from the right sides of Expressions (1) described above. By computing the right side of each of Expressions (2) described below, the d-axis voltage value Vd and the q-axis voltage value Vq are obtained.

[Math. 2]

$$V_d = -\omega \cdot L \cdot I_q + L \cdot dI_d/dt$$

$$V_q = R \cdot I_q + \omega \cdot \Psi_a + L \cdot dI_q/dt \quad (2)$$

Further, in this case, the predetermined error Ethr (determination threshold value for the maximum control error in the normal state) may be set to the value described in the second calculation method.

The reason is as follows. In the region where the motor rotation speed ω is equal to or lower than the predetermined speed ωthr, the d-axis current Id is generally controlled to approximately zero. Therefore, the effect of elimination (disregard) of the terms containing the d-axis current Id on the calculated values is sufficiently small.

(4) Next, a fourth calculation method is described.

The fourth calculation method corresponds to a method in which the terms containing the motor rotation speed ω are eliminated from the Expressions (2) of the third calculation method. By computing the right side of each of Expressions (3) described below, the d-axis voltage value Vd and the q-axis voltage value Vq are obtained.

[Math. 3]

$$V_d = L \cdot dI_d/dt$$

$$V_q = R \cdot I_q + L \cdot dI_q/dt \quad (3)$$

In this case, when the predetermined error Ethr which is a determination threshold value for the maximum control error in the normal state is to be set, the values of the terms containing the motor rotation speed ω, which are eliminated in Expressions (3), in the case where the motor rotation speed ω is set to the predetermined speed ωthr, may be reflected so as to be added to the values described regarding the third calculation method.

(5) Next, a fifth calculation method is described.

The fifth calculation method corresponds to a method in which the derivative terms on the right end of the ride side are eliminated from the Expressions (2) of the third calculation method. By computing the right side of each of Expressions (4) described below, the d-axis voltage value Vd and the q-axis voltage value Vq are obtained.

[Math. 4]

$$V_d = \omega \cdot L \cdot I_q$$

$$V_q = R \cdot I_q + \omega \cdot \Psi_a \quad (4)$$

In this case, when the predetermined error Ethr which is a determination threshold value for the maximum control error in the normal state is to be set, the maximum value of the derivative term, which is eliminated in Expressions (4), may be reflected so as to be added to the values described regarding the third calculation method.

Note that, a maximum value of the derivative term may be determined by derivation of a maximum current response, which determines a maximum amplitude generated by a disturbance or the like based on the predetermined speed ωthr which is an upper-limit value of the motor rotation speed ω, as in the case of the first embodiment described above.

(6) Next, a sixth calculation method is described.

The sixth calculation method corresponds to a method in which the terms containing the motor rotation speed ω are eliminated from the Expressions (4) of the fifth calculation method. By computing the right side on the lower row (q-axis voltage value Vq) of Expressions (5) described below, the d-axis voltage value Vd and the q-axis voltage value Vq are obtained.

[Math. 5]

$$V_d = 0$$

$$V_q = R \cdot I_q \quad (5)$$

In this case, the d-axis voltage value Vd is always zero, and therefore is not required to be computed.

When the predetermined error Ethr which is a determination threshold value of the maximum control error in the normal state is to be set, the values of the terms containing the motor rotation speed ω, which are eliminated from Expressions (4), in the case where the motor rotation speed ω is set to the predetermined speed ωthr, may be added to the values described in the fifth calculation method so as to be reflected therein.

Now, the setting of the predetermined error Ethr in the sixth calculation method is collectively described.

First, the d-axis voltage value Vd and the q-axis voltage value Vq which are maximum in the normal state are determined according to the combination in which the magnitudes of the d-axis voltage value Vd and the q-axis voltage value Vq become maximum, based on the maximum values of the variations in the circuit constants R, L, and $\Psi_a$, the maximum values of the d-axis current Id and the q-axis current Iq, and the predetermined speed ωthr which is the maximum value of the motor rotation speed ω.

Further, the last derivative term of the right side of each of Expressions (1) may be determined based on the maximum amplitude determined by the predetermined speed ωthr, as in the case of the first embodiment 1 described above.

Next, a value is obtained by adding the maximum values of the d-axis voltage deviation Evd and the q-axis voltage deviation Evq between the three-phase voltage commands V* and the actual applied voltage to the maximum d-axis voltage value Vd and q-axis voltage value Vq in the normal state. The predetermined error Ethr is set to a value larger than the value obtained by the addition.

By setting the predetermined error Ethr to a value somewhat larger than the value obtained by the addition, a margin for erroneous detection can be obtained.

Among the first to sixth calculation methods described above, the second to sixth calculation methods involve computing the estimated values of the d-axis voltage value Vd and the q-axis voltage value Vq based on Expressions (1) to (5).

By reducing the terms on the right side of each of Expressions (2) to (5) as in the case of the third to sixth calculation methods, a computation amount can be reduced.

In particular, Expressions (5) of the sixth calculation method has the smallest computation amount. However, the predetermined error Ethr which is a threshold value of the condition to be determined for the control error is required to be set large, since the number of eliminated terms is the largest. Therefore, time required for the detection of the fault becomes relatively long among the above-mentioned calculation methods.

Next, referring to FIGS. 1 and 8, a fault detection operation according to the second embodiment of the present invention is described.

FIG. 8 shows the time responses of the state quantities when the fault in which the upper U-phase switching element UP illustrated in FIG. 1 is placed in the open state occurs, as in the above-mentioned case (FIG. 7). The left end in the figure indicates the fault occurrence time t0.

The d-axis voltage value Vd and the q-axis voltage value Vq are obtained by using Expressions (3) (fourth calculation method). However, it is apparent that detection equivalent or at a higher level can be performed even when another one of the calculation methods is used.

In this case, the upper U-phase switching element UP is in the open state. Therefore, it is understood that the U-phase current Iu (thick solid line among the waveforms in the second row shown in FIG. 8) has horizontal waveform time periods in which the current does not flow and is constantly fixed to zero, as in the case described above.

In approximately the same time periods as the horizontal waveform time periods of the U-phase current Iu, the U-phase voltage command Vu* (waveform in the first row) becomes relatively larger than those of the other phases. It is understood that, as a result, the control error, that is, the d-axis voltage deviation Evd and the q-axis voltage deviation Evq, (waveform in the third row) increases.

It is understood that, reflecting the above-mentioned state, the condition to be determined for the three-phase voltage commands V*, the condition to be determined for the three-phase current, and the condition to be determined for the control error are respectively satisfied (see the waveforms in the fourth row).

Note that, although not shown, the condition to be determined for the power-supply voltage Vb and the motor rotation speed ω is always satisfied.

When all the determination conditions are satisfied, the time signal tc (see the solid line among the waveforms in the fifth row) for determining the establishment of the determination is incremented so as to increase.

A fault detection time t3 is a time at which the time signal tc exceeds the predetermined time tc_thr (threshold value for determining the fault detection). At the fault detection time t3, the open-state fault of the U-phase is determined.

On the other hand, the integrated time (see the broken line among the waveforms in the fifth row) obtained according to the conventional method has a smaller pitch of increase, since the detection timing is delayed as described above. Therefore, a fault detection time t4 is later than the fault detection time t3 according to the first embodiment of the present invention.

Now, for the fault detection operation according to the second embodiment of the present invention, the roles of the determination conditions are summarized and generally described.

First, by using the conditions to be determined for the power-supply voltage Vb and the motor rotation speed $\omega$, the fault can be detected in consideration only of the general output range of the motor 2. Therefore, the need of the abnormality determination based on the output limit of the motor 2 can be eliminated.

Moreover, by the determination condition that the x-phase voltage command Vx* of the target phase is not in the vicinity of zero (is larger than those of the other phases), the state in which the phase current is controlled to the vicinity of zero can be excluded. In addition, by the condition to be determined for the phase current, the state in which the x-phase current does not flow can be detected. Therefore, it is possible to determine the phase in which there is a doubt about the open-state fault.

Further, by the condition to be determined for the control error (d-axis voltage deviation Evd and q-axis voltage deviation Evq), whether or not the state is abnormal can be detected.

Therefore, when all the conditions described above are satisfied, the occurrence of the open-state fault in the x-phase can be determined. Moreover, by performing the same determination processing for all the phases, it is possible to detect the phase in which the open-state fault has occurred.

For the followability of the current control, the followability is kept within the generally used appropriate range so as not to needlessly increase the control error.

In terms of the followability designed as described above, the maximum value of the phase current, which is generated by the disturbance, such as the error between the three-phase voltage commands V* and the actual applied voltage and the estimated error between the three-phase voltage commands V* and the estimated voltage, is estimated from the threshold values for the determination conditions and the width of the parameter fluctuation (variation). In this manner, the threshold value of the abnormal range of the control error is determined.

As a result, erroneous detection can be avoided. At the same time, by determining the occurrence of abnormality based on whether or not the control error is normal without using the determination based on whether or not the state variable exceeds the output limit, the fault can be detected earlier.

Moreover, by determining whether the phase voltage is larger than those of the other phases, erroneous detection when the phase voltage command is in the vicinity of zero can be prevented. Therefore, the improvement of detection accuracy and the rapidity of detection can be both achieved.

The motor control device 1 according to the second embodiment of the present invention detects the abnormal state based on the control error using the maximum value of the control error within the normal operation range as the threshold value, which is estimated from the threshold values of the conditions to be determined for the motor rotation speed $\omega$ and the like without determining the abnormal state based on the output limit of the motor 2.

As a result, when detecting the phase in which the open-state fault has occurred, it is not necessary to detect that the state quantities such as the phase currents and the voltage commands exceed the output limit. Therefore, the abnormal state can be determined based on the increase in the control error. Thus, the time period from the occurrence of the fault to the identification of the faulty state can be shortened.

Namely, the effect of enabling early detection of the fault is obtained. As a result, the processes in accordance with the fault can be rapidly taken.

Step S7 illustrated in FIG. 6 may be changed by combining the condition to be determined for the control error (voltage deviation) described in the second embodiment of the present invention and the condition to be determined for the control error (current deviation) described in the first embodiment described above so that the condition to be determined for the excessively large control error is satisfied when at least any one of the two determination conditions is satisfied. In this manner, the abnormality of the control error can be detected earlier.

As described above, according to the second embodiment (FIG. 8) of the present invention, the control error is a value in accordance with the voltage deviation between the voltage command value and the applied voltage to the motor 2. The estimated value can be used for the applied voltage.

The estimated value of the applied voltage is a value in accordance with at least one of the current and the motor rotation speed $\omega$.

As a result, even without the voltage sensors, the determination conditions can be set in accordance with the applied voltage value estimated from the other state quantities.

Note that, in the first and second embodiments described above, in order to exclude the state of the x-phase voltage command Vx* in which the x-phase current Ix is controlled to the vicinity of zero (state in which the x-phase voltage command Vx* is in the vicinity of zero), the x-phase voltage command Vx* larger than those of the other phases is set as the determination condition for determining that the target x-phase voltage command Vx* is not in the vicinity of zero. However, the determination condition is not limited to the above-mentioned one.

For example, by using whether or not the signs (positive and negative) of the three-phase voltage commands V* are the same as the previous signs as a determination condition, the state in which the three-phase voltage commands V* are in the vicinity of zero (state before and after the three-phase voltage command passes through zero) can be excluded.

Moreover, the motor 2 having the three-phase coils has been described. However, it is apparent that the present invention is applicable even to the case where, for example, a fault occurs in one of the three phases to result in the motor 2 having two phases which can be normally operated.

Third Embodiment

Figure 9:
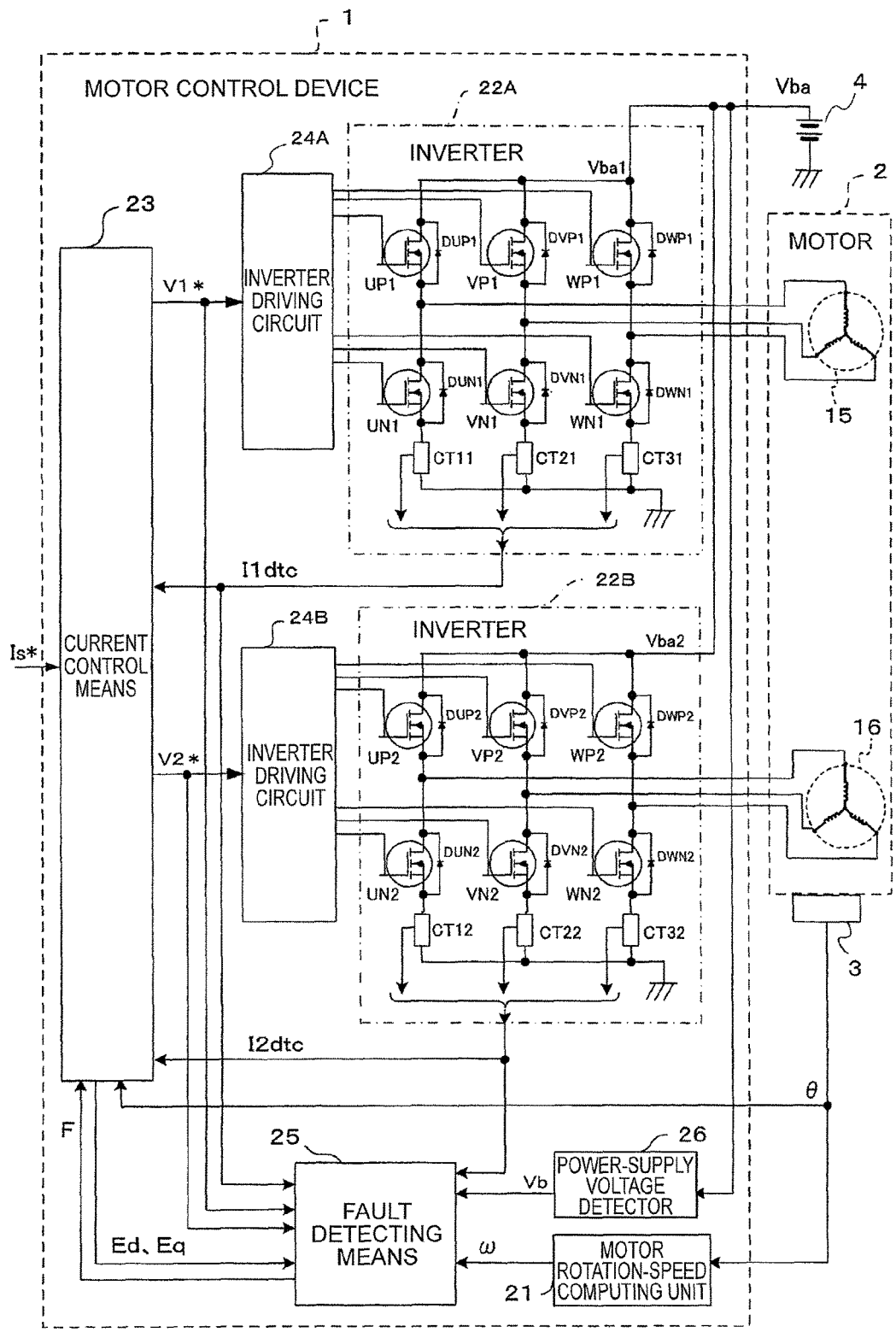
FIG. 9 is a block diagram illustrating a motor control device according to a third embodiment of the present invention together with a peripheral configuration thereof (Embodiment 3).

Although the case where only one set of the windings of the motor 2 and the inverter 22 has been described in the first and second embodiments described above, the motor 2 may have a configuration in which the motor 2 has a plurality of sets of windings of a plurality of phases, as illustrated in FIG. 9.

FIG. 9 is a block diagram schematically illustrating an overall configuration of a motor control device 1 according to a third embodiment of the present invention. The same components as those described above are denoted by the same reference symbols described above, which are followed by the system number. Here, taking the case of two systems as an example, the system numbers "1" and "2" or "A" and "B" are respectively used for a first system and a second system.

In FIG. 9, the motor 2 according to the third embodiment of the present invention includes a plurality (here, two sets) of a winding set 15 and a winding set 16 respectively corresponding to the first system and the second system.

The winding set 15 includes three-phase windings U1-, V1-, and W1-phases on the first system side, whereas the winding set 16 includes three-phase windings U2-, V2-, and W2-phases on the second system side. In each of the winding sets 15 and 16, the phases are connected in the form of a star.

The motor rotation-angle sensor 3 detects each rotation angle θ of the two-system motor 2 and inputs the rotation angle θ to the motor rotation-speed computing unit 21 and the current control means 23 included in the motor control device 1.

Note that, although not shown, the winding sets 15 and 16 constitute a stator. The motor 2 includes the stator, a rotor, and a rotary shaft fixed to the rotor.

Note that, here, the case where the motor 2 is a permanent-magnet synchronous motor including the rotor in which the permanent magnets are arranged and each of the winding sets 15 and 16 has three phases is representatively described as an example. However, the motor 2 is not limited to the configuration illustrated in FIG. 9. It is apparent that the present invention is applicable to the motor 2 which is rotationally driven by a multiphase AC having three or more phases.

In order to control the current supplied to and the voltage applied to the motor 2 including the two-system winding sets 15 and 16, the motor control device 1 includes the current control means 23, inverter driving circuits 24A and 24B, and inverters 22A and 22B. The inverter driving circuits 24A and 24B and the inverters 22A and 22B control the voltages to be applied to the respective phases of the winding sets 15 and 16.

The inverter 22A corresponding to the first system includes, for the respective phases, switching elements UP1, UN1, VP1, VN1, WP1, and WN1, each for controlling the voltage to be applied for each phase, diodes DUP1, DUN1, DVP1, DVN1, DWP1, and DWN1 which are connected in inverse-parallel to the respective switching elements, and current detection circuits CT11, CT21, and CT31 for generating a phase-current detection value I1dtc. Similarly, the inverter 22B corresponding to the second system includes, for the respective phases, switching elements UP2, UN2, VP2, VN2, WP2, and WN2, each for controlling the voltage to be applied for each phase, diodes DUP2, DUN2, DVP2, DVN2, DWP2, and DWN2 which are connected in inverse-parallel to the respective switching elements, and current detection circuits CT21, CT22, and CT32 for generating a phase-current detection value I2dtc. With this configuration, the supply currents to the respective phases for each of the winding sets 15 and 16 are controlled.

Now, an operation of the motor control device 1 according to the third embodiment of the present invention is concretely described.

The motor control device 1 controls a voltage to be applied to each of the windings of the motor 2, supplies electric power from the power supply 4 to the motor 2, and controls a current to flow through each of the windings. In this manner, an output torque of the motor 2, which is approximately proportional to the current, is controlled.

In the motor control device 1, the motor rotation-speed computing unit 21 fetches the detection signal (motor rotation angle θ) from the motor rotation-angle sensor 3 to calculate the rotation speed signal of the motor 2.

Further, the current detection circuits CT11, CT21, CT31, CT12, CT22, and CT32 detect the phase currents flowing in the respective phases of the motor 2 to obtain the phase-current detection values I1dtc and I2dtc.

Concretely, the phase-current detection value I1dtc on the winding set 15 side (first system side) is composed of phase-current detection values Iu1dtc, Iv1dtc, and Iw1dtc for the respective U1-, V1-, and W1-phases.

Similarly, the phase-current detection value I2dtc on the winding set 16 side (second system side) is composed of phase-current detection values Iu2dtc, Iv2dtc, and Iw2dtc for the respective U2-, V2-, and W2-phases.

Note that, here, the detection values of the three phases are collectively referred to simply as the phase-current detection values I1dtc and I2dtc.

The current control means 23 determines the phase-voltage commands V1* and V2* in accordance with the total torque-current request value Is* corresponding to a motor torque target value, the phase-current detection values I1dtc and I2dtc of the respective phases of the motor 2, and the motor rotation-angle θ, as described later.

Note that, the phase-voltage command V1* indicates the U1-phase voltage command V1u*, the V1-phase voltage command V1v*, and the W1-phase voltage command V1w*, whereas the phase-voltage command V2* indicates the U2-phase voltage command V2u*, the V2-phase voltage command V2v*, and the W2-phase voltage command V2w*.

The inverter driving circuit 24A performs PWM modulation on the phase-voltage command V1* to instruct the inverter 22A to perform a switching operation.

The inverter 22A receives a switching-operation signal from the inverter driving circuit 24A to realize chopper control over the switching elements UP1, VP1, WP1, UN1, VN1, and WN1, and supplies a target current to each of the phases U1, V1, and W1 of the winding set 15 included in the motor 2 by the electric power supplied from the power supply 4.

Similarly, the inverter driving circuit 24B and the inverter 22B supply a target current to each of the phases U2, V2, and W2 of the winding set 16 included in the motor 2 in accordance with the phase-voltage commands V2*.

Figure 10:
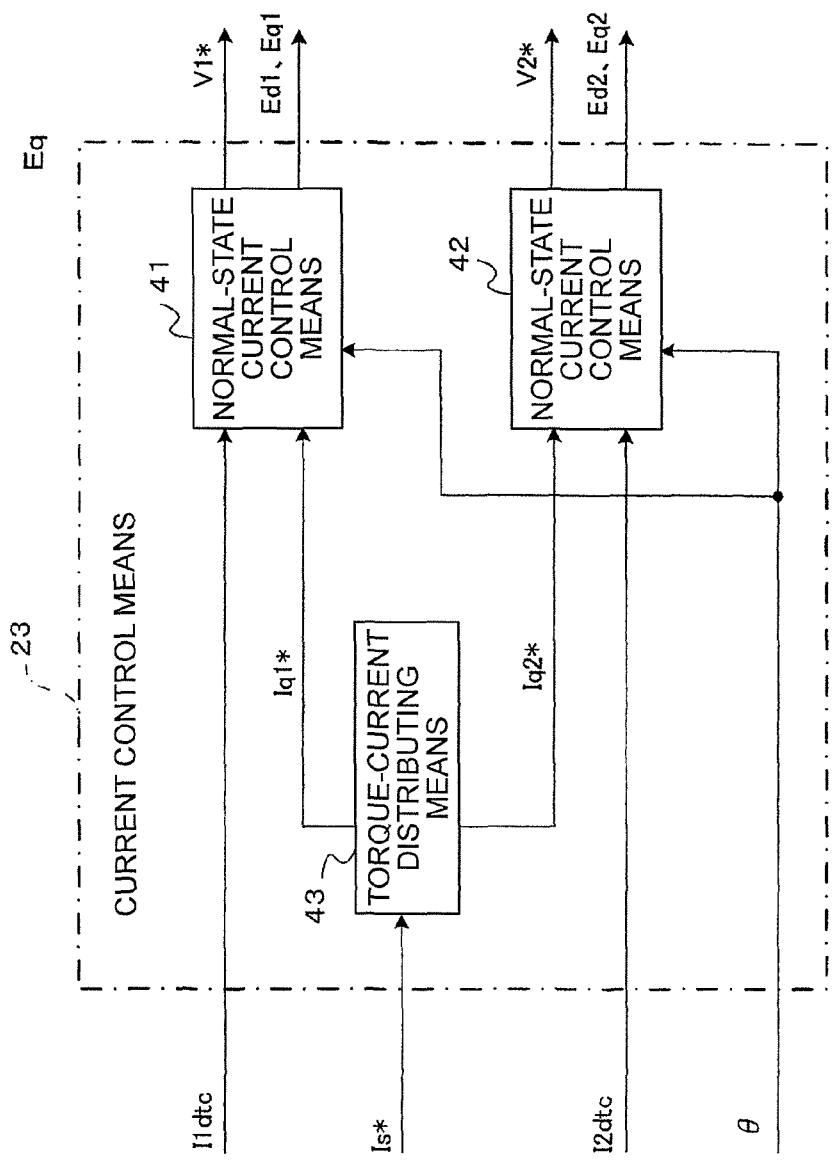
FIG. 10 is a block diagram illustrating a specific configuration of current control means illustrated in FIG. 9 (Embodiment 3).

Next, referring to a specific block diagram of FIG. 10, an operation of the current control means 23 according to the third embodiment of the present invention is described further in detail.

In FIG. 10, the current control means 23 according to the third embodiment of the present invention includes normal-state current control means 41 and 42 for executing a general control method used in the normal state, and torque-current distributing means 43, and is configured so as to be able to control the winding sets 15 and 16 and the inverters 22A and 22B of the two systems (hereinafter also referred to as "first winding driving system and second winding driving system").

The torque-current distributing means 43 divides a total torque-current request value Is* into torque-current command values Iq1* and Iq2* which are torque request values desired to be generated respectively in the first winding driving system and the second winding driving system.

Note that, each of the torque-current command values Iq1* and Iq2* respectively corresponding to the winding driving systems is set to a half of the total torque-current request value Ism*.

Namely, the torque-current distributing means 43 performs setting so as to generate the same torques in the winding driving systems and to obtain a target output torque by the sum thereof.

Subsequently, the normal-state current control means 41 on the first system side performs dq control based on the torque-current command value Iq1* and the phase-current detection value I1dtc to generate the phase-voltage command V1* and input the phase-voltage command V1* to the inverter driving circuit 24A.

Similarly, the normal-state current control means 42 on the second system side performs dq control based on the torque-current command value Iq2* and the phase-current detection value I1dtc to generate the phase-voltage command V2* and input the phase-voltage command V2* to the inverter driving circuit 24B.

Each of the normal-state current control means 41 and 42 is configured, for example, in the same manner as the current control means described above (FIG. 2), and executes commonly used dq control to realize the smooth generation of a motor torque.

Note that, the q-axis current is a current component proportional to the torque (also referred to as "torque current"). On the other hand, although the d-axis current which controls the field flux is controlled to zero in this case, another value may be used instead.

In the above-mentioned manner, in the normal state, the torque currents of the first winding driving system and the second winding driving system are supplied to the respective winding sets 15 and 16 so as to follow the torque-current command values Iq1* and Iq2* of the first system and the second system, respectively. As a result, a desired output torque can be obtained in the motor 2.

Next, schematic functions of the fault detecting means 25 illustrated in FIG. 9 are described.

The fault detecting means 25 according to the third embodiment of the present invention detects the phase of the two systems, each having three phases (six phases in total), in which the open-state fault has occurred.

In FIG. 9, the power-supply voltage Vb corresponding to a terminal voltage Vba of the power supply 4, the motor rotation speed ω, the phase-current detection values I1dtc and I2dtc, the d-axis current deviation Ed (Ed1 and Ed2) and the q-axis current deviation Eq (Eq1 and Eq2) calculated by the current control means (normal-state current control means 41 and 42), and the phase-voltage commands V1* and V2* are input to the fault detecting means 25.

The fault detecting means 25 determines whether or not the open-state fault has occurred in each of the phases based on each of the input information values.

The open-state fault in each phase means, in the case of the U-phase, for example, the disconnection of the motor line in the U-phase, and a fault in which any of the components in paths from the inverter 22A or 22B to the motor 2 in the U-phase is placed in the open state (fault in which the switching element UP or UN in the inverter 22A or 22B is placed in the open state).

When detecting the occurrence of the fault, the fault detecting means 25 generates the fault detection result F and inputs the fault detection result F to the current control means 23.

In this manner, the current control means 23 can perform the processes in accordance with the fault. As the processes in accordance with the fault, the stop of the control over the inverter driving circuit 24, control in case of abnormality in accordance with the fault, and the like are given as examples. However, the processes are any known processing, and therefore the detailed description thereof is herein omitted.

As a general description, the fault detecting means 25 determines, by abnormality doubt determination processing, the phase of the system in which there is a doubt about abnormality. When an absolute value of the current Ix in the x-phase in which there is a doubt about abnormality is small, it is determined that the open-state fault has occurred in the x-phase.

Concretely, the fault detecting means 25 determines that there is a doubt about abnormality when the power-supply voltage Vb is equal to or higher than the predetermined voltage (Vb≥Vthr), the motor rotation speed ω is equal to or lower than the predetermined speed (ω≤ωthr), the x-phase voltage command Vx* of the target x-phase (any one of the U-, V-, and W-phases) is not in the vicinity of zero (is larger than the voltage commands of the other phases), and the control error (d-axis current deviation Ed and the q-axis current deviation Eq) is equal to or larger than the predetermined error.

Moreover, the condition that the control error (d-axis current deviation Ed and the q-axis current deviation Eq) is equal to or larger than the predetermined error when the x-phase voltage command Vx* of the target x-phase (anyone of the U-, V-, and W-phases) is not in the vicinity of zero (is larger than the voltage commands of the other phases) may be replaced by a condition that the x-phase voltage command Vx* is equal to or higher than the predetermined applied voltage (Vx*>Vxthr).

Figure 11:
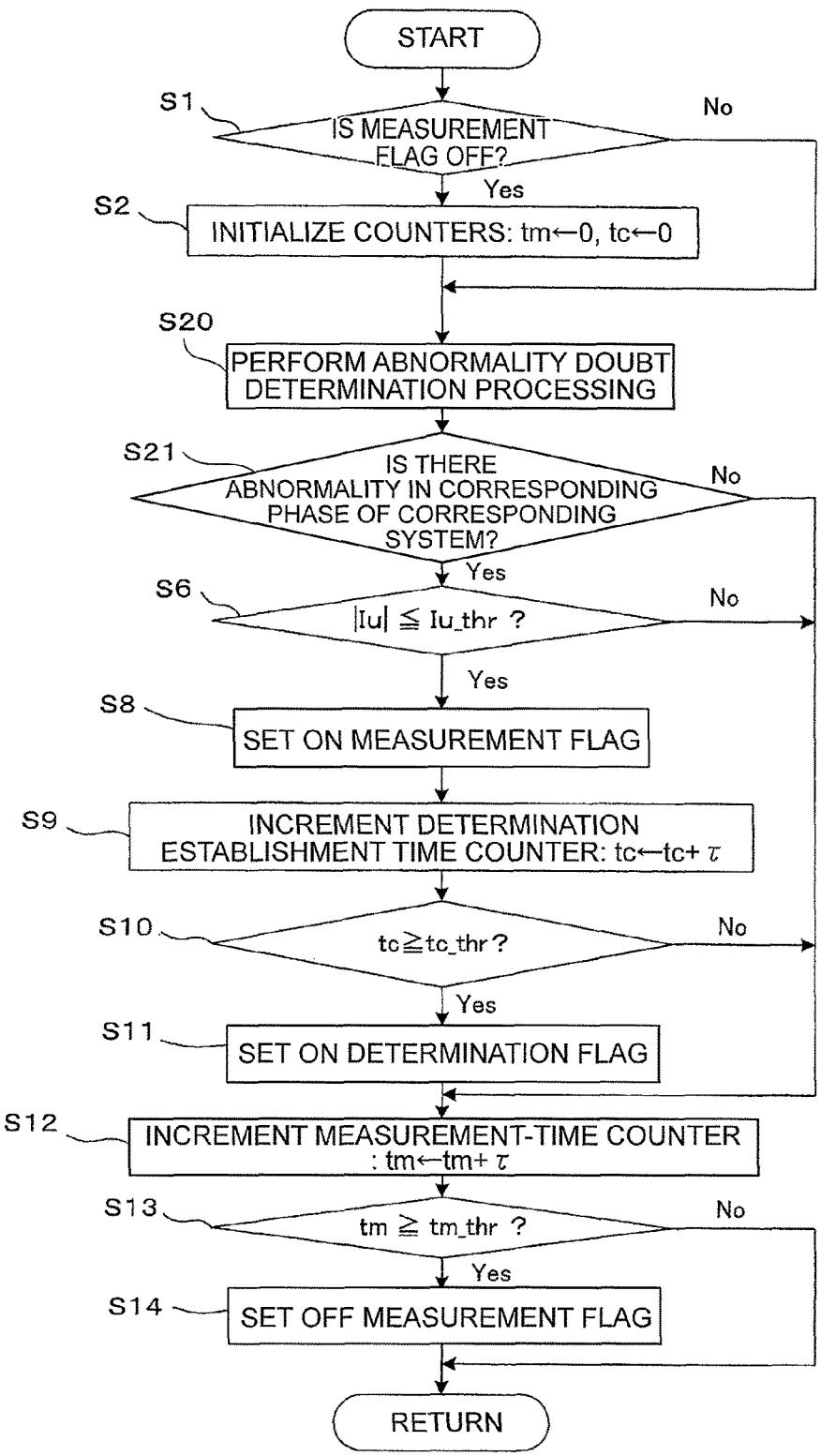
FIG. 11 is a flowchart illustrating a specific operation of fault detecting means according to the third embodiment of the present invention (Embodiment 3).

Next, referring to a flowchart of FIG. 11 corresponding to the first and second embodiments described above (FIG. 6), an operation of the fault detecting means 25 according to the third embodiment of the present invention is described in detail.

The fault detecting means 25 detects a fault in each of the phases by a processing procedure illustrated in FIG. 11 for each of the two systems, each having three phases (six phases in total).

In FIG. 11, processing in Steps S20 and S21 and processing from Step S6 to Step S8 are different from those described above (FIG. 6). However, the remaining processing (Steps S1, S2, and S8 to S14) is the same as that described above, and therefore the detailed description thereof is herein omitted.

Note that, although the U-phase of the first system is described as a target of fault detection as a representative example in FIG. 11, the same processing procedure as that illustrated in FIG. 11 is performed for the other phases of the other systems.

In FIG. 11, subsequent to the measurement-flag determination processing (Step S1) and the time-signal initialization processing (Step S2) in the same manner as that described above, the abnormality doubt determination processing (Step S20) for determining the phase of the system in which there is a doubt about abnormality is first performed.

The details of the abnormality doubt determination processing (Step S20) are described later referring to FIG. 12.

Subsequently, based on the result of determination by the abnormality doubt determination processing (Step S20), whether or not there is abnormality in the target phase (U-phase) of the target system (first system) (Step S21). When there is no abnormality in the corresponding phase of the corresponding system (that is, No), the processing proceeds to increment processing for the measurement time counter (Step S12).

On the other hand, in Step S21, when it is determined that the corresponding phase of the corresponding system is abnormal (that is, Yes), it is then determined whether or not |Iu|≤Iu_thr is satisfied (Step S6). When it is determined that |Iu|>Iu_thr is satisfied (that is, No), the processing proceeds to Step S12.

On the other hand, in Step S6, when it is determined that |Iu|≤Iu_thr is satisfied (that is, Yes), the processing proceeds to the measurement-flag ON processing (Step S8).

The processing after Step S8 is as described above.

Figure 12:
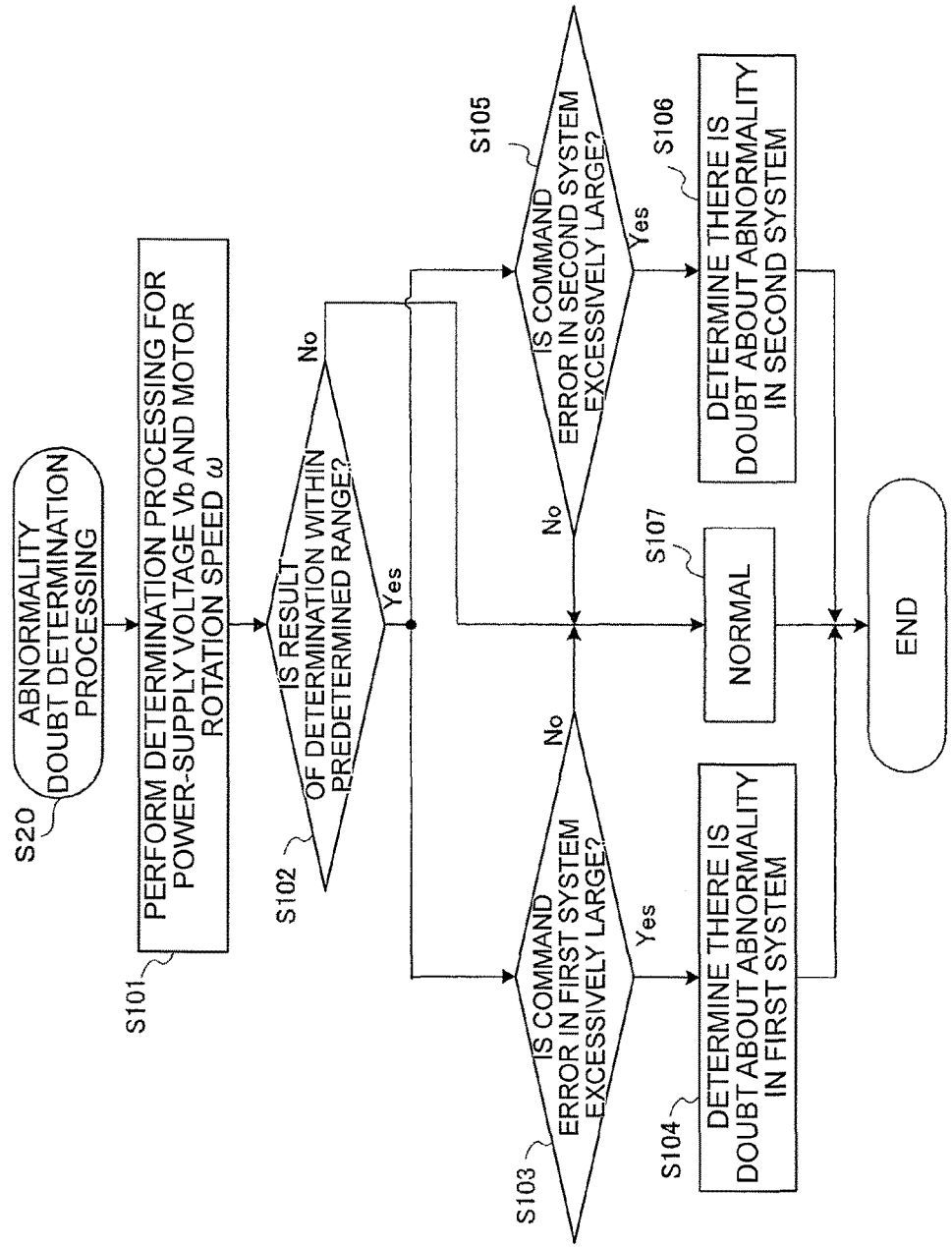
FIG. 12 is a flowchart concretely illustrating abnormality doubt determination processing according to the third embodiment of the present invention (Embodiment 3).

Next, referring to a flowchart of FIG. 12, a concrete procedure of the abnormality doubt determination processing (Step S20) according to the third embodiment of the present invention is described.

In FIG. 12, the fault detecting means 25 first performs the determination processing for the power-supply voltage Vb and the motor rotation speed ω (Step S101) so as to determine whether the power-supply voltage Vb is equal to or higher than a predetermined voltage Vtr and the motor rotation speed ω is equal to or lower than the predetermined speed ωthr (within the predetermined range).

The details of the determination processing for the power-supply voltage Vb and the motor rotation speed ω (Step S101) are described later referring to FIG. 13.

Subsequently, it is determined in Step S101 whether or not the result of determination is within the predetermined range (Step S102). When it is determined that the result of determination is out of the predetermined range (that is, No), the state is regarded as normal. Therefore, flags indicating no doubt about abnormality are set for both the first system and the second system (Step S107). Then, the processing routine illustrated in FIG. 12 is terminated.

On the other hand, in Step S102, when it is determined that the result of determination for the power-supply voltage Vb and the motor rotation speed ω is within the predetermined range (that is, Yes), the processing proceeds to determination processing for determining whether or not the command error is excessively large (Steps S103 and S105).

In Step S103, it is determined whether or not the command error is excessively large in the first system. Namely, whether or not the condition "the control error of the first system is excessively large and the phase-voltage command is not in the vicinity of zero" is satisfied is determined.

Note that, the determination condition in Step S103 may be replaced by a condition that the phase-voltage command is excessively large.

In Step S103, when it is determined that the condition "the control error of the first system is excessively large" is not satisfied (that is, No), the state is regarded as normal. Therefore, the flags indicating no doubt about abnormality are set for both the first system and the second system (Step S107). Then, the processing routine illustrated in FIG. 12 is terminated.

On the other hand, in Step S103, when it is determined that the above-mentioned condition is satisfied (that is, Yes), it is regarded that there is a doubt about abnormality in the first system. Therefore, a flag indicating that the command error in the corresponding phase of the first system is excessively large and there is a doubt about abnormality is set (Step S104). Then, the processing routine illustrated in FIG. 12 is terminated.

Similarly, in Step S105, for the second system, it is determined whether or not the condition "control error in the second system is excessively large" is satisfied. When the condition is not satisfied, the processing proceeds to Step S107. When the condition is satisfied, it is regarded that there is a doubt about abnormality in the second system. Therefore, a flag indicating that the command error in the corresponding phase of the second system is excessively large and there is a doubt about abnormality is set (Step S104). Then, the processing routine illustrated in FIG. 12 is terminated.

Note that, as described above, in the command error determination processing (Steps S103 and S105), the determination condition is that the control error is excessively large and the phase-voltage command is not in the vicinity of zero. As the control error, however, the d-axis current deviation Ed and the q-axis current deviation Eq described above in the first embodiment or the d-axis voltage deviation Evd and the q-axis voltage deviation Evq described above in the second embodiment may be used.

Although only one winding driving system is provided in the first and second embodiments described above, the same computation is performed in each of the first system and the second system in the third embodiment of the present invention. Note that, the detailed description of the d-axis current deviation Ed, the q-axis current deviation Eq, the d-axis voltage deviation Evd, and the q-axis voltage deviation is the same as described above, and therefore herein omitted.

In Step S103, when, for example, $\sqrt{(Ed^2+Eq^2)}$<Ethr is satisfied, it is determined that the control error is not excessively large. When $(\sqrt{(Ed^2+Eq^2)})$≥Ethr is satisfied, it is determined that the control error is excessively large.

Further, the determination of whether or not the phase-current command is not in the vicinity of zero is to determine whether the U-phase voltage command Vu* is not in the vicinity of zero (U-phase voltage command Vu* is maximum), and therefore corresponds to the determination of whether the value of the U-phase voltage command Vu* falls within the range A1 (or A2) shown in FIG. 4.

When the control error in the target system is excessively large and the target phase voltage command Vx* is not in the vicinity of zero, in Step S103, it is determined that a condition for excessively large command error is satisfied (that is, Yes). Otherwise, it is determined that the condition is not satisfied (that is, No).

Note that, in Step S103, the condition of the excessively large control error and the phase voltage command not being present in the vicinity of zero is used as the determination condition. However, the determination may be replaced by the determination of whether or not the target phase voltage command is excessively large.

In this case, whether or not the condition for the excessively large error is satisfied is determined based on whether or not an absolute value of the corresponding phase voltage command (U-phase voltage command Vu* in the example described above) is equal to or larger than a predetermined applied voltage Vxthr.

Namely, when |Vu*|≥Vxthr is satisfied, it is determined that the condition for the excessively large command error is satisfied (that is, Yes). Otherwise, it is determined that the condition is not satisfied (that is, No).

Note that, the value of the predetermined applied voltage Vxthr may be designed in consideration of, for example, the response of the phase voltage command from the disturbance voltage, as described above concerning the setting of the predetermined error Ethr in the first embodiment.

Figure 13:
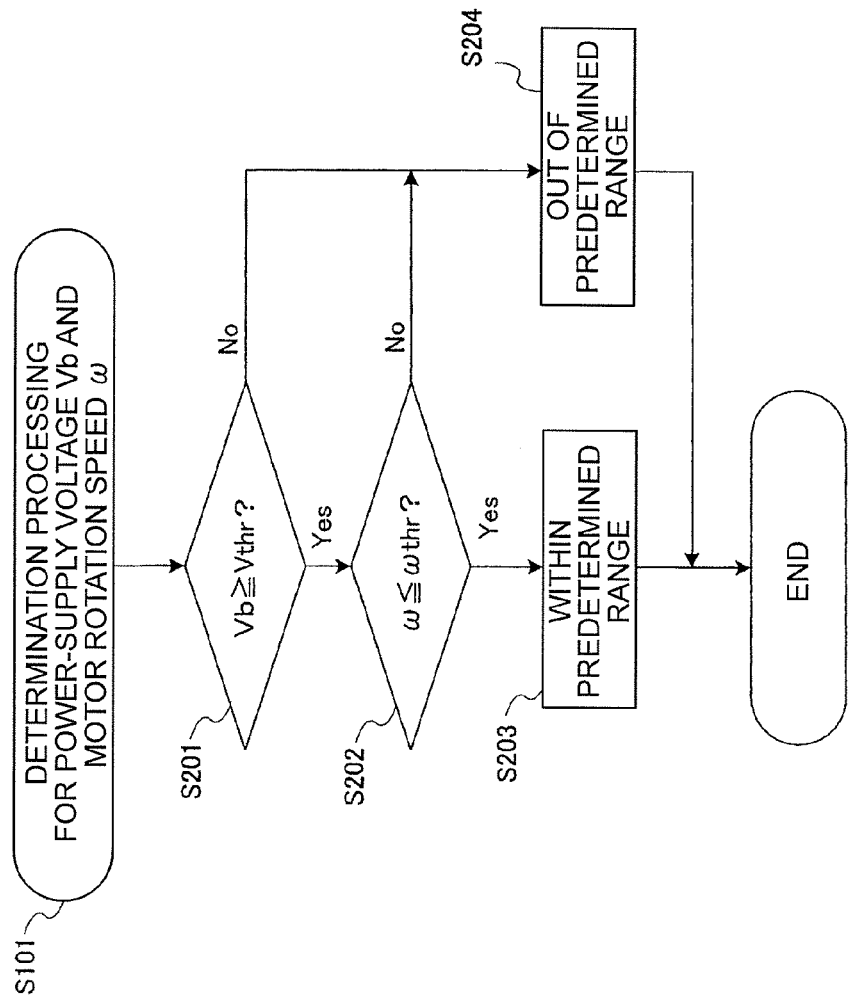
FIG. 13 is a flowchart illustrating an operation of determination for a power-supply voltage and a motor rotation speed according to the third embodiment of the present invention (Embodiment 3).

Next, referring to a flowchart of FIG. 13, a concrete procedure of the determination processing (Step S101) for the power-supply voltage Vb and the motor rotation speed ω according to the third embodiment of the present invention is described.

In FIG. 13, processing in Steps S201 and that in S202 are the same as those in Steps S3 and S4 described above (FIG. 6), respectively.

In Step S201, it is determined whether or not the power-supply voltage Vb is equal to or higher than the predetermined voltage Vthr. When it is determined that Vb<Vthr is satisfied (that is, No), a flag indicating that the power-supply voltage Vb and the motor rotation speed ω are out of the predetermined ranges is set (Step S204). Then, the processing routine illustrated in FIG. 13 is terminated.

On the other hand, when it is determined in Step S201 that Vb≥Vthr is satisfied (that is, Yes), it is then determined whether or not the motor rotation speed ω is equal to or lower than the predetermined speed ωthr (Step S202). When it is determined in Step S201 that ω>ωthr is satisfied (that is, No), the flag indicating that the power-supply voltage Vb and the motor rotation speed ω are out of the predetermined ranges is set (Step S204). Then, the processing routine illustrated in FIG. 13 is terminated.

On the other hand, when it is determined in Step S202 that ω≤ωthr is satisfied (that is, Yes), the flag indicating that the power-supply voltage Vb and the motor rotation speed ω are within the predetermined ranges is set (Step S203). Then, the processing routine illustrated in FIG. 13 is terminated.

As described above, in Steps S20 and S21 illustrated in FIG. 11, it is possible to determine whether or not there is a doubt about abnormality in the target phase of the target system. When there is a doubt about abnormality, the processing proceeds to Step S6 where it is determined that the absolute value of the phase current of the corresponding phase is excessively small. As a result, the occurrence of the open-state fault in the corresponding phase can be detected.

Moreover, the determination processing for the power-supply voltage Vb and the motor rotation speed ω in Step S101 illustrated in FIG. 13 is not required to be individually performed as the determination processing for each of the systems but is performed commonly to the systems. Therefore, the effect of simplifying the computation correspondingly is obtained.

As described above, in order to control the current and applied voltage supplied from the power supply 4 for the motor 2 including the plurality of systems of the winding sets (winding sets 15 and 16) each including windings of the plurality of phases, the motor control device according to the third embodiment (FIGS. 9 to 13) of the present invention includes the inverters 22A and 22B of the plurality of systems for controlling the currents to be supplied from the power supply 4 to the respective phases of the winding sets 15 and 16 of the plurality of systems, which respectively include the plurality of switching elements UP1 to WP1, UN1 to WN1, UP2 to WP2, and UN2 to WN2 for controlling the applied voltages to the respective phases of the winding sets 15 and 16 of the plurality of systems, the current control means 23 for generating the plurality of sets of voltage commands V1* and V2* corresponding to the applied voltages for the inverters 22A and 22B of the plurality of systems in accordance with the plurality of sets of current commands corresponding to the currents to be supplied to the respective phases of the winding sets 15 and 16 of the plurality of systems to control the currents to flow through the respective phases of the winding sets 15 and 16 of the plurality of systems, and the fault detecting means 25 for detecting the disconnection of a wire of any one of the phases of the winding sets 15 and 16 of the plurality of systems or anyone of the inverters 22A and 22B of the plurality of systems, or an open fault of any one of the plurality of switching elements UP1 to WP1, UN1 to WN1, UP2 to WP2, and UN2 to WN2.

The fault detecting means 25 performs the abnormality doubt determination processing for determining which system in which there is a doubt about abnormality among the plurality of systems including the inverters 22A and 22B of the plurality of systems and the winding sets 15 and 16 of the plurality of systems. When it is determined that there is a doubt about abnormality in at least one of the systems and a state in which the phase current of the target phase is equal to or lower than the predetermined current Ix_thr is detected over the predetermined period of time (measurement time period tm_thr) or longer, the occurrence of the open-state fault in the target phase is determined.

In the above-mentioned manner, even when the winding driving systems of the plurality of systems are provided as illustrated in FIG. 9, the open fault can be specified based on the determination of the system in which the abnormality has occurred and the determination of the excessively small state of the phase current. Therefore, the open-state fault in the phase can be accurately specified.

Moreover, in the abnormality doubt determination processing (FIG. 12) performed by the fault detecting means 25, the common use of a part of the determination processing and the mutual comparison between the systems are enabled. As a result, the fault can be detected by a simple computation while the accuracy and the speed of the fault detection are improved.

Moreover, the fault detecting means 25 may determine whether or not the conditions that the power-supply voltage Vb of the power supply 4 is equal to or higher than the predetermined voltage Vthr and that the motor rotation speed ω of the motor 2 is equal to or lower than the predetermined speed ωthr are satisfied, in common to the plurality of systems in the abnormality doubt determination processing (FIG. 12). When the condition is satisfied, in a case where the condition that the control error with respect to the current command or the voltage command is equal to or larger than the predetermined error or that the voltage command in the target phase is equal to or higher than the predetermined phase voltage is satisfied for each of the plurality of systems, the fault detecting means 25 may determine that there is a doubt about abnormality in the target system.

In this manner, a part of the determination is performed commonly. Therefore, the computation can be simplified while the detection accuracy and the detection speed are improved.

Fourth Embodiment

Note that, in the third embodiment (FIGS. 9 to 13) described above, the determination processing for the power-supply voltage Vb (Step S101) is performed commonly to the plurality of systems in the abnormality doubt determination processing (FIG. 12) by the fault detecting means 25. However, determination processing for a power-supply voltage Vb1 and determination processing for a power-supply voltage Vb2 may be performed respectively for the plurality of systems as illustrated in FIG. 14 (Steps S302 and S306).

Figure 14:
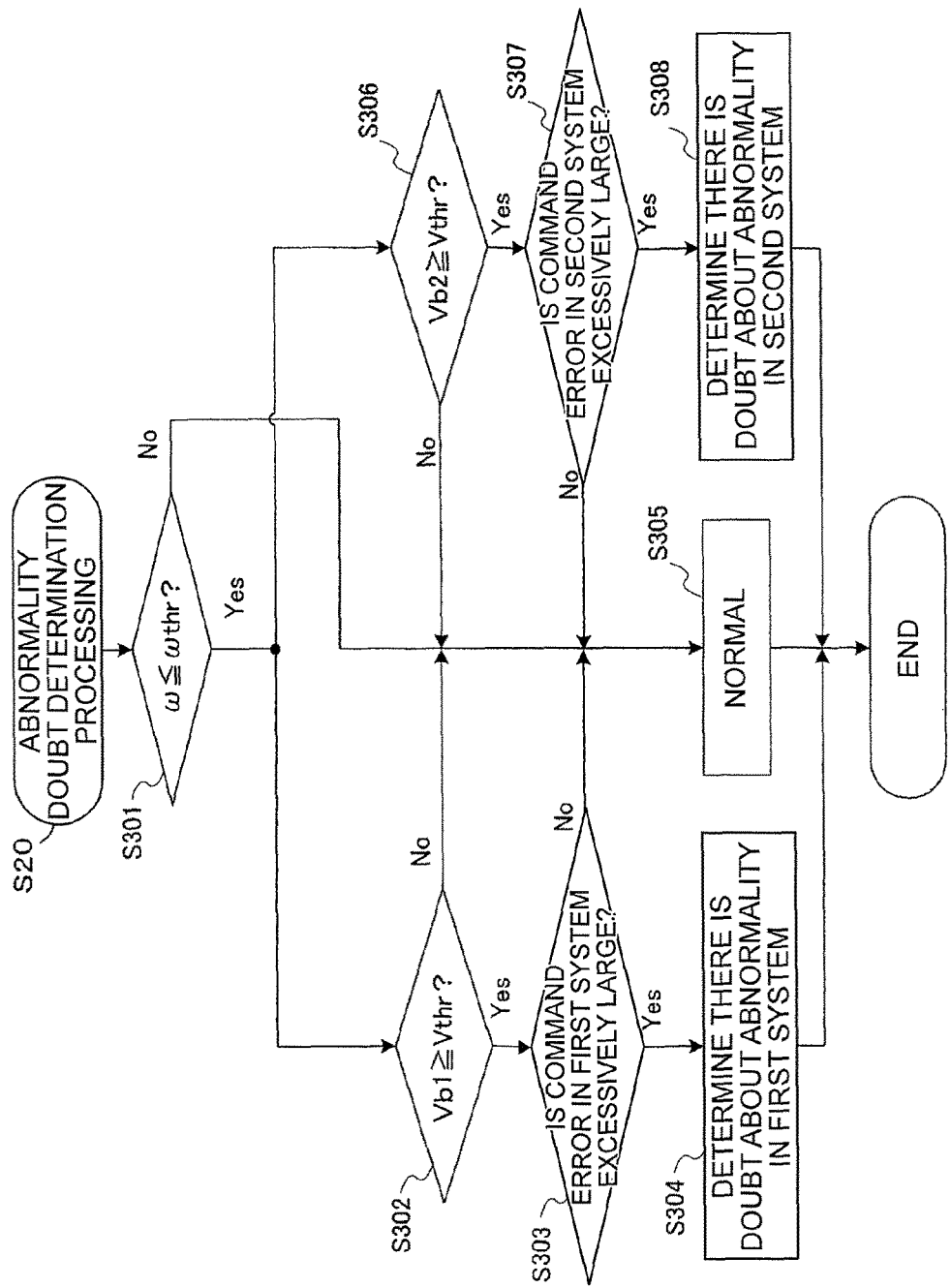
FIG. 14 is a flowchart concretely illustrating abnormality doubt determination processing according to a fourth embodiment of the present invention (Embodiment 4).

FIG. 14 is a flowchart concretely illustrating abnormality doubt determination processing according to a fourth embodiment of the present invention. Processing in Steps S303 to S305, S307, and S308 is the same as that performed in Steps S103, S104, S107, S105, and S106 described above (see FIG. 12), respectively.

The processing of FIG. 14 differs from the above-mentioned processing (FIG. 12) in that the determination processing for the power-supply voltage Vb1 and that for the power-supply voltage Vb2 (Steps S302 and S306) are performed individually for the respective systems.

Note that, a configuration of the fourth embodiment of the present invention is as illustrated in FIGS. 9 and 10, and a basic control processing procedure is as illustrated in FIG. 11.

In this case, however, the power-supply voltage detector 26 illustrated in FIG. 9 measures individually a power-supply voltage Vba1 to be supplied to the first system side and a power-supply voltage Vba2 to be supplied to the second system side.

Moreover, the fault detecting means 25 executes the determination processing for the power-supply voltage Vb1 and the determination processing for the power-supply voltage Vb2 individually for the respective systems.

In FIG. 14, the fault detecting means 25 first determines whether or not the motor rotation speed ω is equal to or lower than the predetermined speed (ω≤ωthr) (Step S301). When it is determined that ω>ωthr is satisfied (that is, No), the state is regarded as normal, as in the case of Step S107 described above (FIG. 12). A flag indicating that there is no doubt about abnormality for both the first system and second system is set (Step S305). Then, the processing routine illustrated in FIG. 14 is terminated.

On the other hand, when it is determined in Step S302 that ω≤ωthr is satisfied (that is, Yes), the processing then proceeds to the determination processing for the power-supply voltage Vb1 and that for the power-supply voltage Vb2 of the respective systems (Steps S302 and S306).

In Step S302, it is determined whether or not the power-supply voltage Vb1 on the first system side is equal to or larger than the predetermined voltage (Vb1≥Vthr). When it is determined that Vb1<Vthr is satisfied (that is, No), the state is regarded as normal (Step S305). Then, the processing routine illustrated in FIG. 14 is terminated.

On the other hand, when it is determined in Step S302 that Vb1≥Vthr is satisfied (that is, Yes), processing for determining whether or not the command error in the target first system is excessively large is then performed (Step S303) as in the case of Step S103 described above (FIG. 12). When it is determined that the command error is not excessively large (that is, No), the state is regarded as normal (Step S305). Then, the processing routine illustrated in FIG. 14 is terminated.

On the other hand, when it is determined in Step S303 that the command error is excessively large (that is, Yes), a flag indicating that the command error in the target phase of the first system is excessively large and therefore there is a doubt about abnormality is set (Step S304) as in the case of Step S104 described above (FIG. 12). Then, the processing routine illustrated in FIG. 14 is terminated.

Steps S302 to S304 illustrated in FIG. 14 correspond to processing for the first system, whereas Steps S306 to S308 correspond to processing for the second system.

For the details of Steps S306 to S308, the same processing as that for the first system is merely performed for each of the values of the second system. Therefore, the detailed description thereof is herein omitted.

As described above, the fault detecting means 25 according to the fourth embodiment (FIGS. 9 and 14) of the present invention performs the abnormality doubt determination processing for each of the plurality of systems.

Namely, in the abnormality doubt determination processing (FIG. 14), the fault detecting means 25 determines which system in which there is a doubt about abnormality among the plurality of systems (first system and second system) configured respectively to include the inverters 22A and 22B and the winding sets 15 and 16.

In the concrete, in the case where the condition that the control error with respect to the current command or the voltage command is equal to or larger than the predetermined error or the voltage command of the target phase is equal to or larger than the predetermined phase voltage is satisfied when, in Steps S302 and S306, each of the power-supply voltages Vb1 and Vb2 of the power supply 4 is equal to or higher than the predetermined voltage Vthr (that is, Yes), and, in Step S301, the motor rotation speed ω of the motor 2 is equal to or lower than the predetermined speed ωthr (Step S301), it is determined that there is a doubt about abnormality in the target system.

Moreover, in the case where it is determined that there is a doubt about abnormality and the state in which the target phase current is equal to or smaller than the predetermined current is detected over the predetermined time period or longer, the fault detecting means 25 determines that the open-state fault has occurred in the target phase.

As described above, the state is detected and the determination is performed individually for each of the systems in the abnormality doubt determination processing. As a result, even in the case where the winding driving systems of the plurality of systems are provided, the open-state fault in the phase can be accurately specified. Further, the detection accuracy can be individually enhanced without depending on the other system.

Fifth Embodiment

Figure 15:
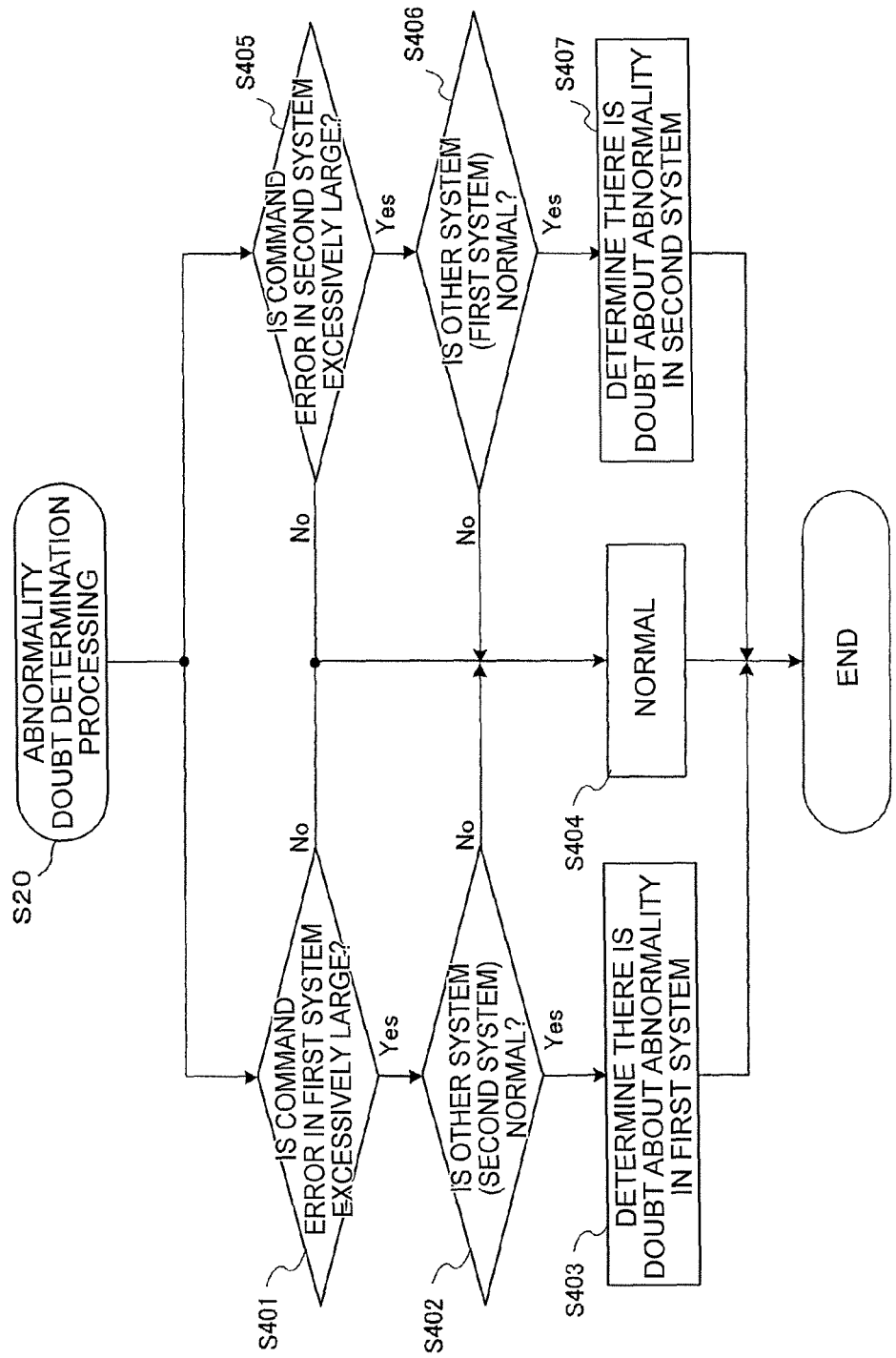
FIG. 15 is a flowchart concretely illustrating abnormality doubt determination processing according to a fifth embodiment of the present invention (Embodiment 5).

Note that, although the power-supply voltage and the motor rotation speed are used in the abnormality doubt determination processing in the third and fourth embodiments described above (FIGS. 12 and 14), the state quantities (the control errors, the voltage commands, and the like) of the respective systems may be compared with each other between the systems, as illustrated in FIG. 15 (Steps S401, S402, S405, and S406).

FIG. 15 is a flowchart concretely illustrating abnormality doubt determination processing according to a fifth embodiment of the present invention. Processing in Steps S401, S403 to S405, and S407 is the same as that performed in Steps S303 to S305, S307, and S308 described above (see FIG. 14), respectively.

The processing of FIG. 15 differs from the processing described above (FIG. 14) in that the state quantities such as the control errors and the voltage commands of the respective systems are compared with each other between the systems (Steps S403 and S406) to determine the system in which there is a doubt about abnormality.

In FIG. 15, the fault detecting means 25 first determines whether or not the command error in the target system (first system in this case) is excessively large (Step S401). When it is determined that the command error is not excessively large (that is, No), the state is regarded as normal. Therefore, a flag indicating that there is no doubt about abnormality for both the first system and the second system is set (Step S404). Then, the processing routine illustrated in FIG. 15 is terminated.

Although the details of the determination in Step S401 of whether or not the command error is excessively large are substantially the same as those in Steps S103 and S303 described above (FIGS. 12 and 14), the details are described later, focusing on different points.

When it is determined in Step S401 that the control error (or the phase-voltage command) is excessively large (that is, Yes), it is then determined whether or not the other system (second system) is in the normal state (Step S402).

When it is determined in Step S402 that the control error (or the phase-voltage command) of the other system sufficiently falls within a normal range (appropriate range) (that is, Yes), it is regarded that there is a doubt about abnormality in the first system (target system). Then, a flag indicating that the command error is excessively large in the target phase of the first system and therefore there is a doubt about abnormality is set (Step S403). Then, the processing routine illustrated in FIG. 15 is terminated.

On the other hand, when it is determined in Step S402 that the control error (or the phase-voltage command) of the other system (second system) is out of the appropriate range (that is, No), the state is regarded as normal (Step S404). Then, the processing routine illustrated in FIG. 15 is terminated.

Steps S401 to S403 illustrated in FIG. 15 correspond to processing for the first system, whereas Steps S405 to S407 correspond to a flow for the second system.

For the details of Steps S405 to S407, the same processing as that for the first system is merely performed for each of the values of the second system. Therefore, the detailed description thereof is herein omitted.

In the processing in Steps S401 and S405 for determining whether or not the command error is excessively large, a determination condition is that the control error is excessively large and the phase-voltage command is not in the vicinity of zero.

In this case, as the control error, the d-axis current deviation Ed and the q-axis current deviation Eq described above in the first embodiment or the d-axis voltage deviation Evd and the q-axis voltage deviation Evq described above in the second embodiment may be used.

Although only one set of the winding driving system is provided in the first and second embodiments described above, the same computation may be performed for each of the first system and the second system in the fifth embodiment of the present invention.

Note that, the d-axis current deviation Ed, the q-axis current deviation Eq, the d-axis voltage deviation Evd, and the q-axis voltage deviation Evq are the same as those described above, and therefore the detailed description thereof is herein omitted.

In Step S401, for example, when $\sqrt{(Ed^2+Eq^2)}<Ethr$ is satisfied, it is determined that the control error is not excessively large. When $(\sqrt{(Ed^2+Eq^2)})\geq Ethr$ is satisfied, it is determined that the control error is excessively large.

Note that, the determination that the phase-current command is not in the vicinity of zero is to determine whether or not the U-phase voltage command Vu* is not in the vicinity of zero (U-phase voltage command Vu* is maximum), and corresponds to the determination of whether or not the value of the U-phase voltage command Vu* falls within the range A1 (or A2) described above (FIG. 4).

Therefore, in Step S401, when the control error in the target system is excessively large and the phase-voltage command Vx* is not in the vicinity of zero, it is determined that the command error is excessively large (that is, Yes). Otherwise, it is determined that the command error is not excessively large (that is, No).

Further, although the determination condition is whether or not the control error is excessively large and whether the phase-voltage command is not in the vicinity of zero, the determination condition may be only whether or not the control error is excessively large.

This is because of the following. The reason for exclusion of the case where the phase-voltage command is in the vicinity of zero from the determination condition is to avoid erroneous determination of the normal state as the abnormal state because zero cross sometimes occurs even when the current is normal. In the fifth embodiment of the present invention, the mutual comparison with the other system is used. Therefore, only in the case where the control error in the other system is small and normal (Step S402) and the control error in the target system is large, it is determined that there is a doubt about abnormality in the target system. As described above, by using the mutual comparison with the other system, it is possible to determine whether or not there is a doubt about abnormality based only on the condition that the control error is excessively large.

Note that, in the fifth embodiment of the present invention, the threshold value indicating that the control error falls within the appropriate range, that is, an appropriate control error Erthr is set to a value smaller than the predetermined error Ethr in the first embodiment described above.

For example, when $\sqrt{(Ed^2+Eq^2)}\leq Erthr$ is satisfied, it is determined that the control error falls within the appropriate range. When it is determined that $(\sqrt{(Ed^2+Eq^2)})>Erthr$ is satisfied, it is determined that the control error is out of the appropriate range.

The predetermined error Ethr in the first embodiment described above is set, supposing the disturbance equal to or smaller than the predetermined speed ωthr which is a determination threshold value of the motor rotation speed ω. In the fifth embodiment of the present invention, however, the relative comparison between the systems is used. Therefore, the predetermined speed ωthr is not required to be taken into consideration. The appropriate control error Erthr can be set to a value smaller than the predetermined error Ethr described above.

In this case, even when the appropriate control error Erthr is set to a value smaller than the predetermined error Ethr, there is no risk of erroneous detection due to the disturbance, since it is already determined that the other system is normal. Similarly, the appropriate control error Erthr of the other system may be set to a value smaller than the predetermined error Ethr.

As described above, the appropriate control error Erthr which is a threshold value for determining an abnormally excessively large state can be set to a value smaller than the predetermined error Ethr described above. Therefore, the fault detection accuracy can be improved, while the time required for the detection from the occurrence of the fault can be shortened (the detection speed can be increased).

Note that, in Step S401 illustrated in FIG. 15, the determination condition is whether or not the control error is excessively large and whether the phase-voltage command is not in the vicinity of zero. However, the determination condition may be replaced by the determination of whether or not the target phase-voltage command is excessively large.

In this case, it is determined whether or not the control error is excessively large based on whether or not the absolute value of the target phase-voltage command (U-phase voltage command Vu* in this example) is equal to or larger than the predetermined applied voltage Vxthr.

In the concrete, in Step S401, when |Vu*|≥Vxthr is satisfied, it is determined that the command error is excessively large (that is, Yes). Otherwise, it is determined that the command error is not excessively large (that is, No).

Note that, the value of the predetermined applied voltage Vxthr may be designed in consideration of, for example, the response of the phase-voltage command from the disturbance voltage, as described regarding the setting of the predetermined error Ethr in the first embodiment described above.

Further, at the same time, in Step S402, it may be determined whether or not the phase-voltage command of the other system is excessively large. Concretely, based on whether or not the absolute value of the U-phase voltage command Vu* of the other system is equal to or smaller than an appropriate applied voltage Vrxthr, it may be determined whether or not the other system is normal.

In this case, when |Vu*|≤Vrxthr is satisfied in Step S402, it is determined that the other system is normal (that is, Yes). Otherwise, it is determined that the other system is not normal (that is, No).

Note that, the appropriate applied voltage Vrxthr may be set to a value smaller than the predetermined applied voltage Vxthr.

The predetermined applied voltage Vxthr can be discussed in the same manner as that for the predetermined error. In the third embodiment (FIG. 12) described above, the predetermined applied voltage is designed in consideration of the response of the phase-voltage command from the disturbance voltage. In the fifth embodiment of the present invention, the relative comparison between the systems is used. Therefore, the disturbance voltage determined by the motor rotation speed ω and the like is not required to be taken into consideration. Thus, the predetermined applied voltage Vxthr can be set to, for example, a value smaller than the value used in the third embodiment described above.

In this case, even when the predetermined applied voltage Vxthr is set to a small value, it is already determined that the other system is normal. Therefore, there is no risk of erroneous detection due to the disturbance.

Similarly, the appropriate applied voltage Vrxthr of the other system may be set to a value smaller than the predetermined applied voltage Vxthr in the third embodiment described above.

As described above, the predetermined applied voltage Vxthr which is a threshold value for determining an abnormally excessively large state can be set to the value smaller than that used in the third embodiment described above. Therefore, the fault detection accuracy is improved, while the time required for the detection from the occurrence of the fault can be shortened (the detection speed can be increased).

As described above, the fault detecting means 25 according to the fifth embodiment of the present invention performs the abnormality doubt determination processing (FIG. 15) for each of the plurality of systems respectively including the inverters 22A and 22B and the winding sets 15 and 16 so as to determine, among the plurality of systems, the system in which there is a doubt about abnormality.

Concretely, in the case where the control error in the target system among the plurality of systems is equal to or larger than the predetermined error and the control error in the other system falls within the appropriate error range, it is determined that there is a doubt about abnormality in the target system.

Moreover, in the case where it is determined that there is a doubt about abnormality and the state in which the target phase current is equal to or smaller than the predetermined current is detected over the predetermined time period or longer, the fault detecting means 25 determines that the open-state fault has occurred in the target phase.

Further, the fault detecting means 25 performs the abnormality doubt determination processing for each of the plurality of systems. In the case where the voltage command in the target system among the plurality of systems is equal to or higher than the predetermined applied voltage and the voltage command in the other system falls within the predetermined appropriate applied voltage range, it is determined that there is a doubt about abnormality in the target system.

The control error has a value in accordance with the current command, and is concretely a value in accordance with the current deviation (d-axis current deviation Ed and q-axis current deviation Eq) between the value of the current command and the current.

Alternatively, the control error has a value in accordance with the voltage deviation (d-axis voltage deviation Evd and q-axis voltage deviation Evq) between the voltage command value and the applied voltage. The applied voltage has an estimated value in accordance with at least one of the current and the motor rotation speed ω.

In this manner, even when the plurality of winding driving systems are provided as described in the third and fourth embodiments, the open-state fault of the phase can be accurately specified. Thus, the accuracy and speed of the fault detection can be improved.

Also, the condition for the motor rotation speed ω or for the power-supply voltage Vb is not required. Therefore, the fault detection is not limited by the operating state. Thus, the fault can be detected over a large operation range.

Further, the mutual comparison between the systems is performed. Therefore, in comparison with the case where the determination processing is performed alone, the threshold value of the abnormal state can be set to a smaller value (in a direction in which the determination becomes severe). Thus, the accuracy and speed of the fault detection can be further improved.

Note that, in the description given above, the processing for determining whether or not the command error is excessively large (Step S401) and the processing for determining whether or not the other system is normal (Step S402) are individually carried out. However, the above-mentioned processing may be combined so that a difference between the target system and the other system is determined.

In this case, the fault detecting means 25 performs the abnormality doubt determination processing for each of the plurality of systems. In the case where the control error in the target system among the plurality of systems is larger than the control error in the other system by a predetermined differential error or larger, or in the case where a value obtained by subtracting the control error in the other system from the control error in the target system is equal to or larger than a predetermined differential error, it is determined that there is a doubt about abnormality in the target system.

Concretely, it is supposed that the control error in the target system is E1 and the control error in the other system is E2. Then, the above-mentioned condition may be replaced by a condition whether or not a value obtained by subtracting an absolute value of the control error E2 of the other system from an absolute value of the control error E1 of the target system is equal to or larger than a predetermined differential error Ethrd.

The above-mentioned processing is represented in the form of an expression. Then, when the following Expression (6) is satisfied in Step S402, the processing proceeds to Step S403 where it is regarded that there is a doubt about abnormality in the target system (first system).

$$|E1|-|E2|\geq Ethrd \tag{6}$$

On the other hand, when Expression (6) is not satisfied, the processing proceeds to Step S404 where it is determined that the target system is in the normal state.

The processing for determining whether or not the command error is excessively large (Step S405) and the processing for determining whether or not the other system is normal (Step S406) may be replaced in the same fashion.

Note that, the predetermined differential error Ethrd may be set to a difference between the predetermined error and the appropriate control error. In this manner, the same effects as those described above can be obtained.

Further, the phase-voltage command may be used in place of the control error in the same manner. When the voltage command of the target system is larger than the voltage command of the other system by a predetermined differential applied voltage or larger, or when a value obtained by subtracting the voltage command of the other system from the voltage command of the target system is equal to or larger than a predetermined differential applied voltage, the fault detecting means 25 can determine that there is a doubt about abnormality in the target system.

Concretely, it is supposed that the phase voltage command in the target system (first system) is Vx1 and the phase voltage command in the other system (second system) is Vx2. Then, the above-mentioned condition may be replaced by a condition whether or not a value obtained by subtracting an absolute value of the phase voltage command Vx2 of the other system from an absolute value of the phase voltage command Vx1 of the target system is equal to or larger than a predetermined differential applied voltage Vxthrd.

The above-mentioned processing is represented in the form of an expression. Then, when the following Expression (7) is satisfied in Step S402, the processing proceeds to Step S403 where it is regarded that there is a doubt about abnormality in the target system (first system).

$$|Vx1|-|Vx2|\geq Vxthrd \tag{7}$$

On the other hand, when Expression (7) is not satisfied, the processing proceeds to Step S404 where it is determined that the target system is in the normal state.

The processing for determining whether or not the command error is excessively large (Step S405) and the processing for determining whether or not the other system is normal (Step S406) may be replaced in the same fashion.

The predetermined differential applied voltage Vxthrd may be set to a difference between the predetermined applied voltage and the appropriate applied voltage. In this manner, the same effects as those described above can be obtained.

It is apparent that Expression (6) described above can be equivalently modified. Expression (6) can be expressed, for example, as the following Expression (8).

$$|E1|\geq |E2|+Ethrd \tag{8}$$

Namely, the above-mentioned condition can be replaced by a condition that the absolute value of the control error E1 of the target system is larger than the absolute value of the control error E2 of the other system by the predetermined differential error Ethrd.

The phase-voltage command is treated in the same manner. Expression (7) described above can be expressed as Expression (9) below.

$$|Vx1|\geq |Vx2|+Vxthrd \tag{9}$$

Namely, the above-mentioned condition can be replaced by a condition that the absolute value of the phase voltage command Vx1 of the target system is larger than the absolute value of the phase voltage command Vx2 of the other system by the predetermined differential applied voltage Vxthrd.

In the description given above, only the value of the target system is used in the processing for determining whether or not the command error is excessively large (Step S401). However, a sum of the value of the target system and the value of the other system may be used for the determination.

Concretely, the condition may be replaced by a condition that a value obtained by adding the absolute value of the control error E1 of the target system and the absolute value of the control error E2 of the other system is equal to or larger than a predetermined added error Ethrs or larger.

The processing is expressed in the form of a formula. When the following Expression (10) is satisfied in Step S401, it is determined that the command error in the target system is excessively large.

$$|E1|+|E2|\geq Ethrs \tag{10}$$

On the other hand, when Expression (10) is not satisfied, since the command error is not excessively large, the processing proceeds to Step S404 where it is determined that the target system is in the normal state.

Namely, in the case where the sum of the control error in the target system and the control error in the other system is equal to or larger than the predetermined added error Ethrs and the control error in the other system falls within the appropriate error range, the fault detecting means 25 determines that there is a doubt about abnormality in the target system.

Note that, the predetermined added error may be set to a sum of the predetermined error and the appropriate control error. In this manner, the same effects as those described above can be obtained.

The phase-voltage command is used in the same manner in place of the control error. Concretely, the above-mentioned condition may be replaced by a condition that a value obtained by adding the absolute value of the phase-voltage command Vx1 of the target system and the absolute value of the phase-voltage command Vx2 of the other system is equal to or larger than a predetermined added applied voltage Vxthrs.

In this case, in the case where the sum of the voltage command in the target system and the voltage command in the other system is equal to or larger than the predetermined added applied voltage Vxthrs and the voltage command in the other system falls within an appropriate applied voltage range, the fault detecting means 25 determines that there is a doubt about abnormality in the target system.

The above-mentioned processing is expressed in the form of a formula. When the following Expression (11) is satisfied in Step S401, it is determined that the command error in the target system is excessively large.

$$|Vx1|+|Vx2|\geq Vxthrs \tag{11}$$

On the other hand, when Expression (11) is not satisfied, since the command error is not excessively large, the processing proceeds to Step S404 where it is determined that the target system is in the normal state.

The above-mentioned modification can be performed even for Step S405, as in the case of Step S401.

Note that, the predetermined added applied voltage Vxthrs may be set to the sum of the predetermined applied voltage and the appropriate applied voltage. In this manner, the same effects as those described above can be obtained.

It is apparent that Expression (10) described above can be equivalently modified. For example, Expression (10) can be expressed as the following Expression (12).

$$|E1| \geq Ethrd - |E2| \qquad (12)$$

Namely, the condition can be replaced by a condition that the absolute value of the control error E1 of the target system is equal to or larger than a value obtained by subtracting the absolute value of the control error E2 of the other system from the predetermined differential error Ethrd.

The phase-voltage command is similarly treated. Expression (11) described above can be expressed as Expression (13) below.

$$|Vx1| \geq Vxthrd - |Vx2| \qquad (13)$$

Namely, the condition can be replaced by a condition that the absolute value of the phase-voltage command Vx1 of the target system is equal to or larger than a value obtained by subtracting the absolute value of the phase-voltage command Vx2 of the other system from the predetermined differential applied voltage Vxthrd.

Sixth Embodiment

Figure 16:
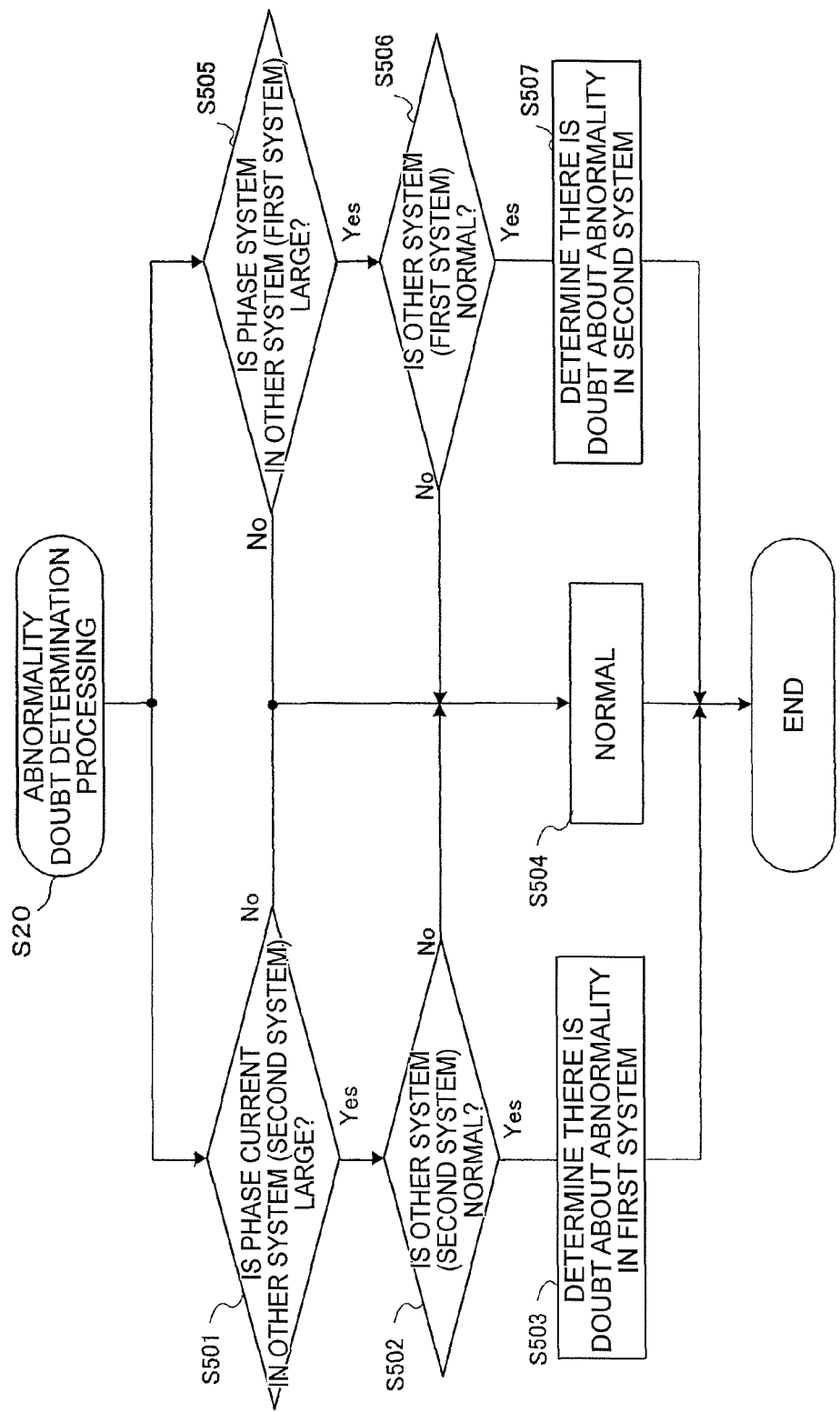
FIG. 16 is a flowchart concretely illustrating abnormality doubt determination processing according to a sixth embodiment of the present invention (Embodiment 6).

Note that, although whether or not the condition for the excessively large command error in the target system is satisfied is determined in the abnormality doubt determination processing in the fifth embodiment described above (FIG. 15), the state quantities (the phase current and the like) of the respective systems may be compared with each other between the systems, as illustrated in FIG. 16 (Steps S501, and S505).

FIG. 16 is a flowchart concretely illustrating abnormality doubt determination processing according to a sixth embodiment of the present invention. Processing in Steps S502 to S504, S506, and S507 is the same as that performed in Steps S402 to S404, S406, and S407 described above (see FIG. 15).

FIG. 16 differs from the processing described above (FIG. 15) in that the phase currents (state quantities) of the corresponding phases of the respective systems are compared with each other between the systems to determine the system in which there is a doubt about abnormality.

In FIG. 16, the fault detecting means 25 first determines whether or not the phase current of the corresponding phase of the other system has "a large value which is not in the vicinity of zero" for the other system (second system in this case) which is not the target system (Step S501).

Processing performed in Step S501 involves determining whether or not there is a doubt about abnormality based on a difference between the systems, and is different from the determination processing (processing for determining whether or not the phase current of the phase of the target system to be determined is in the excessively small state) in Step S6 illustrated in FIG. 11.

Concretely, in the determination processing in Step S501, whether or not an absolute value of the phase current I2x of the corresponding phase of the other system is equal to or larger than a predetermined normal current Ixthrn ($|I2x| \geq Ixthrn$) is determined. The predetermined normal current Ixthrn may be set larger than the predetermined current Ix_thr.

In Step S501, when it is determined that the phase current of the other system is in the vicinity of zero (that is, No), the state is regarded as normal (Step S504). Then, the processing routine illustrated in FIG. 16 is terminated.

On the other hand, in Step S501, when it is determined that the phase current of the other system is large (that is, Yes), then it is determined whether or not the other system (second system) is normal (Step S502).

In Step S502, as described above (Step S402), it is determined whether or not the control error (or the voltage command) of the other system (second system) which is not the target system falls within an appropriate range which is smaller than a reference value indicating that the control error is excessively large.

The appropriate range means the range in which the control error is sufficiently regarded as normal. The appropriate range contains a margin to an actual abnormal range. Therefore, the control error out of the appropriate range does not always mean abnormality.

In Step S502, when it is determined that the control error in the other system (second system) does not fall within the appropriate range in which the control error is sufficiently normal (that is, No), the state is regarded as normal (Step S504). When it is determined that the control error in the other system falls within the appropriate range (that is, Yes), it is regarded that the condition for a doubt about abnormality in the target system (first system) is satisfied (Step S503). Then, the processing routine illustrated in FIG. 16 is terminated.

In Step S504 for the determination of the normal state, the flag indicating there is no doubt about abnormality in any of the systems is set, as in the case described above (Steps S107, S305, and S404).

Further, in Step S503, the flag indicating that the command error of the corresponding phase of the first system is excessively large and there is a doubt about abnormality is set, as in the case described above (Steps S104, S304, and S403).

Note that, processing for the second system (Steps S505 to S507) is the same as that for the first system (Steps S501 to S503), and therefore the description thereof is herein omitted.

As described above, in the case where the phase current of the corresponding phase in the other system which is not the target system is equal to or larger than the predetermined normal current Ixthrn and the control error in the other system falls within the appropriate error range, the fault detecting means 25 according to the sixth embodiment (FIG. 16) of the present invention determines that there is a doubt about abnormality in the target system.

Alternatively, in the case where the corresponding phase current in the other system is equal to or larger than the predetermined normal current Ixthrn and the voltage command in the other system falls within the appropriate applied voltage range, the fault detecting means 25 determines that there is a doubt about abnormality in the target system.

A value of the control error is a value in accordance with the current command, and concretely has a value in accordance with the current deviation (d-axis current deviation Ed and q-axis current deviation Eq) between the value of the current command and the current.

Alternatively, the value of the control error is a value in accordance with the voltage deviation (d-axis voltage deviation Evd and q-axis voltage deviation Evq) between the voltage command value and the applied voltage. A value of the applied voltage is an estimated value in accordance with at least one of the current and the motor rotation speed ω.

Further, as in the third to fifth embodiments described above, the fault detecting means 25 performs the abnormality doubt determination processing (FIG. 16) for determining which system in which there is a doubt about abnormality among the plurality of systems respectively including the inverters 22A and 22B and the winding sets 15 and 16. In the case where there is a doubt about abnormality in one of the systems and a state in which the phase current of the target phase is equal to or smaller than the predetermined range is detected over the predetermined time period or longer, it is determined that the open-state fault has occurred in the target phase.

As a result, as in the case described above, even when the winding driving systems of the plurality of systems are provided, the open-state fault in the phase can be accurately specified. In addition, the condition for the motor rotation speed ω or for the power-supply voltage is not required. Thus, there is no limitation on the operating state. Therefore, the fault detection can be performed over a large operation range. Further, the mutual comparison between the systems is carried out. Therefore, the threshold value for determination is not required to be set in consideration of the disturbance. Therefore, the speed of the fault detection can be improved.

Further, the predetermined normal current Ixthrn can be determined without taking the disturbance voltage determined by the motor rotation speed ω or the like into consideration. Even when the criterion of determination is set as described above, it can be determined that the other system is normal. Therefore, there is no risk of erroneous detection due to the disturbance.

As a result, the threshold value is not required to be set in consideration of the disturbance. Therefore, the fault detection speed can be improved.

Moreover, the mutual comparison between the systems is carried out. Therefore, as compared with the case where the determination is performed alone, the threshold value for the abnormal state can be set to a smaller value (in the direction in which the determination becomes severer). Thus, the accuracy and speed of the fault detection can be improved.

Moreover, in the processing for determining whether or not the phase current in the other system is large (Step S501), only the value of the other system is used. However, a sum of the value of the target system and that of the other system may be used for the determination.

In this case, in the case where the sum of the phase current of the target phase in the target system and the corresponding phase current in the other system is equal to or larger than the predetermined added current and the control error in the other system falls within the appropriate error range, the fault detecting means 25 determines that there is a doubt about abnormality in the target system.

Alternatively, in the case where the sum of the target phase current of the target system and the corresponding phase current in the other system is equal to or larger than the predetermined added current and the voltage command in the other system falls within the appropriate applied voltage range, the fault detecting means 25 determines that there is a doubt about abnormality in the target system.

Concretely, the determination may be replaced by the determination of whether or not a value obtained by adding the absolute value of the phase current I1x in the target system and the absolute value of the phase current I2x in the other system is equal to or larger than a predetermined added current Ixthrs.

The determination is expressed in the form of a formula. When the following Expression (14) is satisfied in Step S501, it is determined that the phase current of the other system is large.

$$|I1x|+|I2x| \geq Ixthrs \tag{14}$$

On the other hand, when Expression (14) is not satisfied, it is determined that the phase current of the other system is in the vicinity of zero. Then, the processing proceeds to Step S504 where the state is regarded as normal.

Note that, the predetermined added current Ixthrs may be set to a sum of the predetermined current and the predetermined normal current. In this manner, the same effects as those described above can be obtained.

Moreover, in the processing for determining whether or not the phase current in the other system is large (Step S501), only the value of the other system is used. However, a difference between the value of the target system and that of the other system may be used for the determination.

In this case, in the case where the control error in the other phase falls within the appropriate error range when the corresponding phase current in the other system is larger than the target phase current of the target system by the predetermined differential current or larger or the value obtained by subtracting the target phase current in the target system from the corresponding phase current in the other system is equal to or larger than the predetermined differential current, the fault detecting means 25 determines that there is a doubt about abnormality in the target system.

Alternatively, in the case where the voltage command in the other phase falls within the appropriate applied voltage range when the corresponding phase current in the other system is larger than the target phase current of the target system by the predetermined differential current or larger or the value obtained by subtracting the target phase current in the target system from the corresponding phase current in the other system is equal to or larger than the predetermined differential current, the fault detecting means 25 determines that there is a doubt about abnormality in the target system.

Concretely, the above-mentioned determination may be replaced by determination of whether or not the value obtained by subtracting the absolute value of the phase current I1x in the target system from the absolute value of the phase current I2x in the other system is equal to or larger than a predetermined differential current Ixthrd.

The determination is expressed in the form of a formula. When the following Expression (15) is satisfied in Step S501, it is determined that the phase current of the other system is large.

$$|I2x|-|I1x| \geq Ixthrd \tag{15}$$

On the other hand, when Expression (15) is not satisfied, it is determined that the phase current of the other system is in the vicinity of zero. Then, the processing proceeds to Step S504 where the state is regarded as normal.

Note that, the predetermined differential current Ixthrd may be set to a value obtained by subtracting the predetermined current from the predetermined normal current. In this manner, the same effects as those described above can be obtained.

Further, it is apparent that Expression (15) described above can be equivalently modified. Expression (15) can be expressed as Expression (16) below.

$$|I2x| \geq |I1x|+Ixthrd \tag{16}$$

Namely, the above-mentioned condition can be replaced by a condition that the absolute value of the phase current I2x in the other system is larger than the absolute value of the phase current I1x in the target system by the predetermined added current Ixthrs.

Seventh Embodiment

Only the motor control device 1 including the fault detecting means 25 capable of rapidly performing the processing has been described in the first to sixth embodiments described above (FIGS. 1 to 16). However, the motor 2 may be used for a steering assist motor, while the motor control device 1 may be used for an electric power steering device for a vehicle, as illustrated in FIG. 17.

Figure 17:
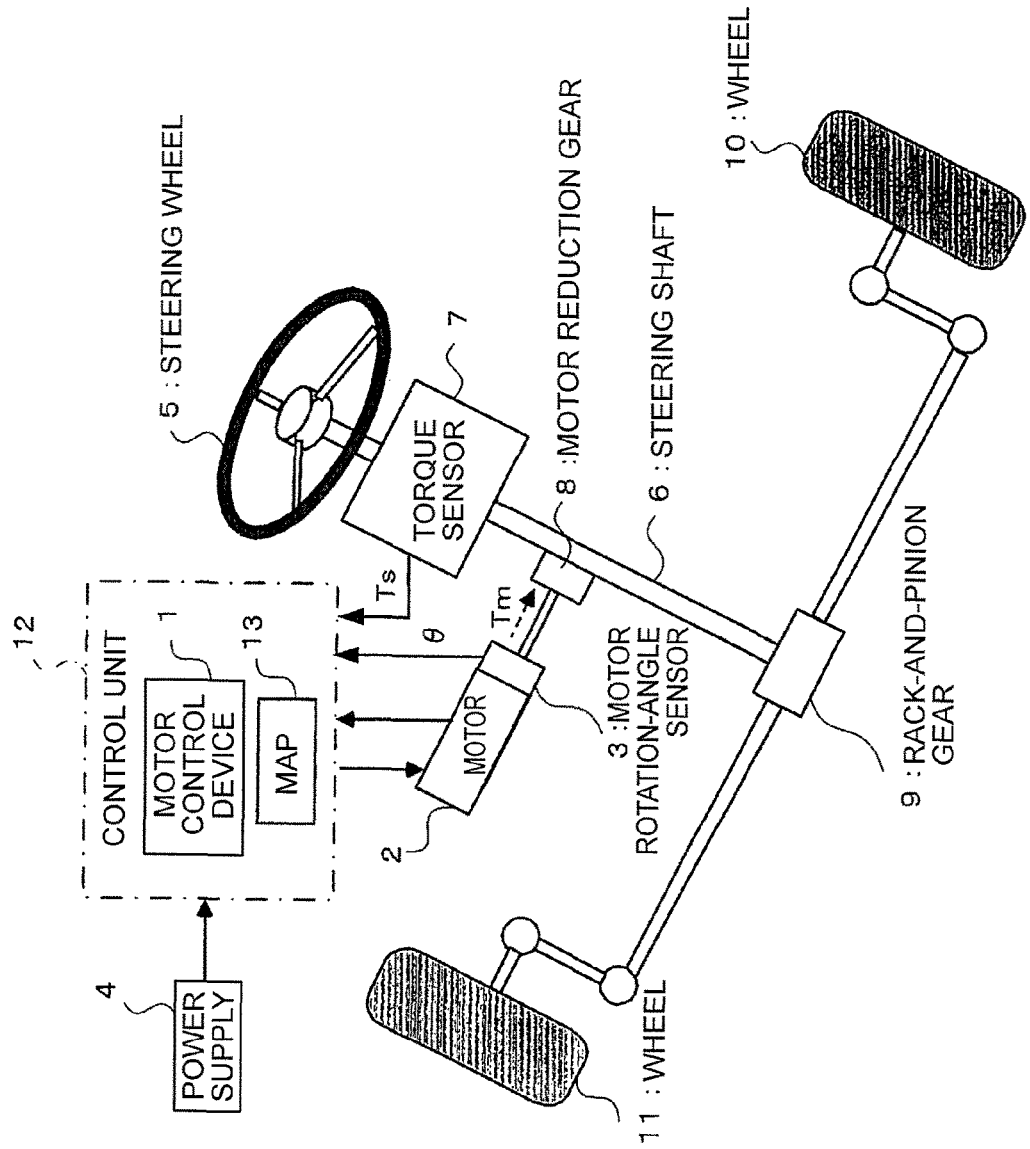
FIG. 17 is a block configuration diagram schematically illustrating an electric power steering device according to a seventh embodiment of the present invention (Embodiment 7).

FIG. 17 is a block configuration diagram schematically illustrating an electric power steering device according to a third embodiment of the present invention. The same components as those described above (see FIG. 1) are denoted by the same reference symbols described above.

In FIG. 17, the electric power steering device includes the motor 2 for generating a motor torque Tm (assist force), the motor rotation-angle sensor 3, the power source 4, a steering wheel 5 to be operated by a driver of the vehicle, a steering shaft 6 coupled to the steering wheel 5, a torque sensor 7 for detecting a steering torque Ts applied by the driver to the steering wheel 5, a motor reduction gear 8 provided between the motor 2 and the steering shaft 6, a rack-and-pinion gear 9 provided at a distal end of the steering shaft 6, right and left wheels 10 and 11 to which the steering force is transmitted from the steering shaft 6 through the rack-and-pinion gear 9, and a control unit 12 for controlling the motor 2 based on a state variable of the motor 2 and input information from the respective sensors 3 and 7.

When the driver steers the steering wheel 5, the torque sensor 7 detects the steering torque Ts applied from the steering wheel 5 to the steering shaft 6 and inputs the detected steering torque Ts to the control unit 12.

The motor rotation-angle sensor 3 detects the motor rotation angle θ of the motor 2 and inputs the detected motor rotation angle θ to the control unit 12.

The detection value of the motor rotation angle θ is input to the motor control device 1 (see FIGS. 1 and 2) included in the control unit 12, and is used to determine the three-phase voltage commands V* in the current control means 23 and to compute the motor rotation speed ω as in the case described above.

The control unit 12 includes the motor control device 1 and a map 13 for calculating the torque-current command (q-axis current command Iq*) corresponding to a target value of the motor torque Tm based on the steering torque Ts.

The map 13 included in the control unit 12 stores in advance a target value of the motor torque Tm to be output from the motor 2. The map 13 determines the direction and the magnitude of the motor torque Tm in accordance with the steering torque Ts output from the torque sensor 7 to calculate the torque-current command for controlling the motor 2.

The steering torque Ts applied to the steering wheel 5 by the driver is transmitted from the steering shaft 6 through the rack-and-pinion gear 9 to a rack to steer the wheels 10 and 11.

The motor 2 is coupled to the steering shaft 6 through the motor reduction gear 8. The assist force (motor torque Tm) generated from the motor 2 is transmitted to the steering shaft 6 through the motor reduction gear 8 to act so as to reduce the steering torque Ts to be applied by the driver at the time of steering.

The motor control device 1 included in the control unit 12 determines the direction and the magnitude of a target assist force to be output by the motor 2 from the map 13 in accordance with the steering torque Ts output from the torque sensor 7 and controls the current to be supplied from the power source 4 to the motor 2 so as to generate the target assist force.

Namely, the motor control device 1 controls the current flowing through the motor 2 so as to realize the torque-current command (q-axis current command Iq*).

By this current, an assist force equal to the target assist force is generated from the motor 2.

In the electric power steering device illustrated in FIG. 9, if the control is immediately stopped in the case of a fault while the vehicle is running, the degree of discomfort felt by the driver becomes greater. Therefore, it is desired to reduce the feeling of discomfort by continuing the control as much as possible.

Therefore, in the control unit 12, when the occurrence of some fault is detected by the fault detecting means, the current control means 23 included in the motor control device 1 identifies a portion in which the fault has occurred and the content of the fault within a short period of time so as to continue good control as much as possible and performs the control on the motor 2 in accordance with the portion in which the fault has occurred and the content of the fault.

For example, when the open-state fault is identified in the U-phase of the motor 2, the control on the motor 2 is continued by controlling the currents only for the other V-phase and W-phase.

Moreover, by identifying the portion in which the fault has occurred and the content of the fault within a short period of time, the control can be quickly switched to another control corresponding to the state of fault after the occurrence of the fault.

As described above, the electric power steering device according to the seventh embodiment (FIG. 17) of the present invention includes the control unit 12 including the motor control device 1 described above, the power source 4 for supplying power to the control unit 12, the steering wheel 5 to be operated by the driver of the vehicle, the steering shaft 6 coupled to the steering wheel 5, the torque sensor 7 for detecting the steering torque Ts to be applied from the steering wheel 5 to the steering shaft 6, and the motor 2 which is connected to the steering shaft 6 and which generates the motor torque Tm (assist force) for reducing the steering torque Ts.

The control unit 12 controls the power supplied to the motor 2 so as to generate the target assist force based on the detection value of the steering torque Ts and continues the control on the motor 2 by the control in accordance with the detected content of the fault when the open fault is detected in the path from the motor control device 1 to the motor 2.

As a result, for example, the fault which brings one of the phases of the motor 2 in the open state can be quickly and accurately identified within a short period of time. Therefore, the control can be quickly and accurately switched to the control corresponding to the fault state. Therefore, the degree of discomfort felt by the driver can be reduced.

REFERENCE SIGNS LIST 1 motor control device, 2 motor, 3 motor rotation-angle sensor, 4 power supply, 5 steering wheel, 6 steering shaft, 7 torque sensor, 8 motor reduction gear, 10, 11 wheel, 12 control unit, 13 map, 15, 16 winding set, 21 motor rotation-speed computing unit, 22, 22A, 22B inverter, 23 current control means, 24, 24A, 24B inverter driving circuit, 25 fault detecting means, 26 power-supply voltage detector, 31 two-phase converting means, 32 subtracter, 34 d-axis controller, 35 q-axis controller, 36 three-phase converting means, 41, 42 normal-state current control means, 43 torque-current distributing means, CT1, CT2, CT3, CT11, CT21, CT31, CT12, CT22, CT32 current detector, DUP, DVP, DWP, DUN, DVN, DWN, DUP1, DUN1, DVP1, DVN1, DWP1, DWN1, DUP2, DUN2, DVP2, DVN2, DWP2, DWN2 diode, Ed d-axis current deviation, Eq q-axis current deviation, Ethr predetermined error, Evd d-axis voltage deviation, Eqv q-axis voltage deviation, F fault detection result, I* current command, Id d-axis current, Iq q-axis current, Id* d-axis current command, Iq* q-axis current command, Iu U-phase current, Iv V-phase current, Iw W-phase current, Iq1*, Iq2* torque-current command value, Is* total torque-current request value, Iu_thr predetermined current, Ke induced-voltage constant, t0 fault occurrence time, t1, t3 fault detection time, tc time signal, tc_thr predetermined time, Tm motor torque, Ts steering torque, UP, VP, WP, UN, VN, WN, UP1, UN1, VP1, VN1, WP1, WN1, UP2, UN2, VP2, VN2, WP2, WN2 switching element, V* three-phase voltage command, Vb power-supply voltage, Vd* d-axis voltage command, Vq* q-axis voltage command, Vd d-axis voltage value, Vq q-axis voltage value, Vthr predetermined voltage, Vu* U-phase voltage command, Vv* V-phase voltage command, Vw* W-phase voltage command, θ motor rotation angle, ω motor rotation speed, ωthr predetermined speed, S20 abnormality doubt determination processing.

The invention claimed is:

1. A motor control device for controlling a current and an applied voltage to a motor having a plurality of phases, comprising:
an inverter for supplying electric power from a power supply to the motor;
current control means for generating a voltage command in accordance with a current command to control the current to the motor;
an inverter driving circuit for driving the inverter in accordance with the voltage command to control the applied voltage to the motor; and
fault detecting means for detecting a fault occurrence state based on the voltage command, a power-supply voltage of the power supply, a motor rotation speed of the motor, and currents in the plurality of phases,
wherein when the power-supply voltage is equal to or higher than a predetermined voltage,
when the motor rotation speed is equal to or lower than a predetermined speed,
when a voltage command in a target phase is not in a vicinity of zero,
when a phase current of the target phase is equal to or lower than a predetermined current, and
when a state in which a control error with respect to the current command or the voltage current is equal to or larger than a predetermined error is detected over a predetermined time period or longer,
the fault detecting means determines occurrence of an open-state fault in the target phase.

2. The motor control device according to claim 1, wherein a value of the control error comprises a value in accordance with the current command.

3. The motor control device according to claim 2, wherein a value of the control error comprises a value in accordance with a current deviation between a value of the current command and the current.

4. The motor control device according to claim 1, wherein a value of the control error comprises a value in accordance with a voltage deviation between a value of the voltage command and the applied voltage.

5. The motor control device according to claim 4, wherein a value of the applied voltage comprises an estimated value.

6. The motor control device according to claim 5, wherein the value of the applied voltage comprises an estimated value in accordance with at least one of the current and the motor rotation speed.

7. The motor control device according to claim 1, wherein a condition that the voltage command in the target phase is not in the vicinity of zero is set based on a condition that the voltage command in the target phase is larger than that of another phase.

8. A motor control device for controlling a current and an applied voltage supplied from a power supply for a motor including a plurality of systems of winding sets each including windings of a plurality of phases, comprising:
inverters of the plurality of systems comprising a plurality of switching elements for controlling applied voltages to the plurality of respective phases of the winding sets of the plurality of systems, for controlling currents to be supplied from the power supply to the plurality of respective phases of the winding sets of the plurality of systems;
current control means for generating a plurality of sets of voltage commands corresponding to the applied voltages to the respective inverters of the plurality of systems in accordance with a plurality of sets of current commands corresponding to the currents to be supplied to the plurality of respective phases of the winding sets of the plurality of systems so as to control the currents to flow through the plurality of respective phases of the winding sets of the plurality of systems; and
fault detecting means for detecting disconnection of a wiring of any one of the plurality of respective phases of the winding sets of the plurality of systems or the inverters of the plurality of systems or an open fault of any one of the plurality of switching elements,
wherein the fault detecting means is configured to:
perform abnormality doubt determining processing for determining which system in which there is a doubt about abnormality among the plurality of systems respectively including the inverters of the plurality of systems and the winding sets of the plurality of systems; and
determine that an open-state fault in the target phase is occurred, when it is determined that there is a doubt about abnormality and when a state in which a phase current of a target phase is equal to or lower than a predetermined current is detected over a predetermined time period or longer.

9. The motor control device according to claim 8, wherein, in the abnormality doubt determining processing:
the fault detecting means determines whether or not conditions that a power-supply voltage of the power supply is equal to or higher than a predetermined voltage and that a motor rotation speed of the motor is equal to or lower than a predetermined speed are satisfied, in common to the plurality of systems; and
when the conditions are satisfied, in a case where a condition that a control error with respect to the current command or the voltage command is equal to or larger than a predetermined error or that the voltage command in the target phase is equal to or larger than a predetermined phase voltage is satisfied, the fault detecting means determines that there is a doubt about abnormality in the target system.

10. The motor control device according to claim 8, wherein:
the fault detecting means performs the abnormality doubt determining processing for each of the plurality of systems; and
when a power-supply voltage of the power supply is equal to or higher than a predetermined voltage and when a motor rotation speed of the motor is equal to or lower than a predetermined speed, in a case where a condition that a control error with respect to the current command or the voltage command is equal to or larger than a predetermined error or that the voltage command in the target phase is equal to or larger than a predetermined phase voltage is satisfied, the fault detecting means determines that there is a doubt about abnormality in the target system.

11. The motor control device according to claim 8, wherein:
the fault detecting means performs the abnormality doubt determination processing for each of the plurality of systems; and
in a case where a control error in a target system of the plurality of systems is equal to or larger than a predetermined error and where a control error in another system falls within an appropriate error range, the fault detecting means determines that there is a doubt about abnormality in the target system.

12. The motor control device according to claim 8, wherein:
the fault detecting means performs the abnormality doubt determination processing for each of the plurality of systems; and
in a case where the phase current of a corresponding phase in another system which is not a target system among the plurality of systems is equal to or larger than a predetermined normal current and where a control error in the another system falls within an appropriate error range, the fault detecting means determines that there is a doubt about abnormality in the target system.

13. The motor control device according to claim 8, wherein:
the fault detecting means performs the abnormality doubt determination processing for each of the plurality of systems; and
in a case where a sum of a control error in a target system of the plurality of systems and a control error in another system is equal to or larger than a predetermined added error and where the control error in the another system falls within an appropriate error range, the fault detecting means determines that there is a doubt about abnormality in the target system.

14. The motor control device according to claim 8, wherein:
the fault detecting means performs the abnormality doubt determination processing for each of the plurality of systems; and
in a case where a control error in a target system of the plurality of systems is larger than a control error in another system by a predetermined differential error or larger or where a value obtained by subtracting the control error in the another system from the control error in the target system is equal to or larger than the predetermined differential error, the fault detecting means determines that there is a doubt about abnormality in the target system.

15. The motor control device according to claim 8, wherein:
the fault detecting means performs the abnormality doubt determination processing for each of the plurality of systems; and
in a case where a sum of the phase current of the target phase in a target system of the plurality of systems and the phase current of a corresponding phase in another system is equal to or larger than a predetermined added current and where a control error in the another system falls within an appropriate error range, the fault detecting means determines that there is a doubt about abnormality in the target system.

16. The motor control device according to claim 8, wherein:
the fault detecting means performs the abnormality doubt determination processing for each of the plurality of systems; and
when the phase current of a corresponding phase in another system which is not a target system of the plurality of systems is larger than the phase current of the target phase in the target system by a predetermined differential current or larger or when a value obtained by subtracting the phase current of the target phase in the target system from the phase current of the corresponding phase in the another system is equal to or larger than the predetermined differential current, in a case where a control error in the another system falls within an appropriate error range, the fault detecting means determines that there is a doubt about abnormality in the target system.

17. The motor control device according to claim 8, wherein:
the fault detecting means performs the abnormality doubt determination processing for each of the plurality of systems; and
in a case where the voltage command in a target system of the plurality of systems is equal to or higher than a predetermined applied voltage and where the voltage command in another system falls within an appropriate applied voltage, the fault detecting means determines that there is a doubt about abnormality in the target system.

18. The motor control device according to claim 8, wherein:
the fault detecting means performs the abnormality doubt determination processing for each of the plurality of systems; and
in a case where a sum of the voltage command in a target system of the plurality of systems and the voltage command in another system is equal to or larger than a predetermined added applied voltage and where the voltage command in the another system falls within an appropriate applied voltage range, the fault detecting means determines that there is a doubt about abnormality in the target system.

19. The motor control device according to claim 8, wherein:
the fault detecting means performs the abnormality doubt determination processing for each of the plurality of systems; and
in a case where the voltage command in a target system of the plurality of systems is larger than the voltage command in another system by a predetermined differential applied voltage or larger or where a value obtained by subtracting the voltage command in the another system from the voltage command in the target system is equal to or larger than the predetermined differential applied voltage, the fault detecting means determines that there is a doubt about abnormality in the target system.

20. The motor control device according to claim 8, wherein:
the fault detecting means performs the abnormality doubt determination processing for each of the plurality of systems; and
in a case where the phase current of a corresponding phase in another system which is not a target system among the plurality of systems is equal to or larger than a predetermined normal current and where the voltage command in the another system falls within an appropriate applied voltage range, the fault detecting means determines that there is a doubt about abnormality in the target system.

21. The motor control device according to claim 8, wherein:
the fault detecting means performs the abnormality doubt determination processing for each of the plurality of systems; and
in a case where a sum of the phase current of the target phase in a target system of the plurality of systems and the phase current of a corresponding phase in another system is equal to or larger than a predetermined added current and where the voltage command in the another system falls within an appropriate applied voltage range, the fault detecting means determines that there is a doubt about abnormality in the target system.

22. The motor control device according to claim 8, wherein:
the fault detecting means performs the abnormality doubt determination processing for each of the plurality of systems; and
when the phase current of a corresponding phase in another system of the plurality of systems is larger than the phase current of the target phase in a target system by a predetermined differential current or larger or when a value obtained by subtracting the phase current of the target phase in the target system from the phase current of the corresponding phase in the another system is equal to or larger than the predetermined differential current, in a case where a voltage command in the another system falls within an appropriate applied voltage range, the fault detecting means determines that there is a doubt about abnormality in the target system.

23. The motor control device according to claim 9, wherein a value of the control error comprises a value in accordance with the current command.

24. The motor control device according to claim 23, wherein a value of the control error comprises a value in accordance with a current deviation between a value of the current command and the current.

25. The motor control device according to claim 9, wherein a value of the control error comprises a value in accordance with a voltage deviation between a value of the voltage command and the applied voltage.

26. The motor control device according to claim 25, wherein a value of the applied voltage comprises an estimated value.

27. The motor control device according to claim 26, wherein the value of the applied voltage comprises an estimated value in accordance with at least one of the current and the motor rotation speed.

28. An electric power steering device, comprising:
a control unit comprising the motor control device according to claim 1;
a power supply for supplying electric power to the control unit;
a steering wheel to be operated by a driver of a vehicle;
a steering shaft coupled to the steering wheel;
a torque sensor for detecting a steering torque applied from the steering wheel to the steering shaft; and
a motor connected to the steering shaft, for generating an assist force for reducing the steering torque,
wherein the control unit is configured to:
control the electric power supplied to the motor so as to generate a target assist force based on a detection value of the steering torque; and
continue controlling the motor when an open fault in a path from the motor control device to the motor is detected.

* * * * *